United States Patent [19]

Karakida et al.

[11] Patent Number: 5,675,601
[45] Date of Patent: Oct. 7, 1997

[54] SEMICONDUCTOR LASER DEVICE

[75] Inventors: Shoichi Karakida; Motoharu Miyashita; Yutaka Mihashi, all of Tokyo, Japan

[73] Assignee: Mitsubishi Denki Kabushiki Kaisha, Tokyo, Japan

[21] Appl. No.: 584,235

[22] Filed: Jan. 11, 1996

[30] Foreign Application Priority Data

Apr. 6, 1995 [JP] Japan ................................ 7-081386

[51] Int. Cl.$^6$ ................................................ H01S 3/19
[52] U.S. Cl. ............................. 372/46; 372/45; 437/129
[58] Field of Search ..................... 372/46, 45; 437/129

[56] References Cited

U.S. PATENT DOCUMENTS

| | | | |
|---|---|---|---|
| 4,404,678 | 9/1983 | Aiki et al. | 372/45 |
| 5,048,036 | 9/1991 | Scifres et al. | 372/45 |
| 5,346,856 | 9/1994 | Jones et al. | 437/132 |
| 5,389,797 | 2/1995 | Bryan et al. | 257/21 |
| 5,416,790 | 5/1995 | Yodoshi et al. | 372/46 |
| 5,574,743 | 11/1996 | van der Poel et al. | 372/45 |
| 5,581,570 | 12/1996 | Yoshida et al. | 372/45 |

FOREIGN PATENT DOCUMENTS

| | | |
|---|---|---|
| 0054439 | 6/1982 | European Pat. Off. . |
| 0531542 | 3/1993 | European Pat. Off. . |
| 0544357 | 6/1993 | European Pat. Off. . |
| 0614257 | 9/1994 | European Pat. Off. . |
| 0616400 | 9/1994 | European Pat. Off. . |
| 674373 | 9/1995 | European Pat. Off. . |
| 59-39083 | 3/1984 | Japan . |
| 3239386 | 10/1991 | Japan . |

OTHER PUBLICATIONS

Sin et al, "High-Power InGaAs-GaAs Strained Quantum Well Lasers With InGaP Cladding Layers On P-type GaAs Substrates", Journal of Applied Physics, vol. 72, No. 7, Oct. 1992, pp. 3212 and 3214.

People et al. "Calculation Of Critical Layer Thickness Versus Lattice Mismatch For $Ge_xSi_{1-x}$/Si Strained-Layer Heterostructures", Applied Physics Letters, vol. 3, No. 1, 1 Aug., 1985 pp. 322-324.

Lo et al, "Bonding By Atomic Rearrangement Of InP/InGaAsP 1.5 µm Wavelength Lasers On GaAs Substrates", Applied Physics Letters, vol. 58, No. 18, May 1991, pp. 1961 and 1963.

Ishikawa et al, "0.98-1.02 µm Strained InGaAs/AlGaAs Double Quantum-Well High-Power Lasers With GaIn P Buried Waveguides", IEEE Journal of Quantum Electronics, vol. 29, No. 6, Jun. 1993, pp. 1936-1942.

*Primary Examiner*—James W. Davie
*Attorney, Agent, or Firm*—Leydig, Voit & Mayer, Ltd.

[57] ABSTRACT

A semiconductor laser device includes, on a first conductivity type GaAs substrate, successively, a first conductivity type GaAs buffer layer, a first conductivity type $Al_sGa_{1-s}As$ (0<s<1) cladding layer, a quantum well active layer having a structure that can produce an oscillation wavelength of 0.9~1.2 µm and including a well layer comprising $In_xGa_{1-x}As$ (0<x<1) and a barrier layer comprising $Al_yGa_{1-y}As$ (0<y<s), a second conductivity type $Al_tGa_{1-t}As$ (1<t<y) upper cladding layer, a second conductivity type GaAs contact layer, and a multiple reflection film layer alternatingly laminating first and second semiconductor materials which have the same conductivity type as the adjacent semiconductor materials and have the different refractive indices in number of layers, first and second electrodes, and a pair of laser resonator facets perpendicular to the active layer and the multiple reflection film layer. Therefore, a semiconductor laser device in which generation of large mode hops is suppressed, the generation of kinks is reduced, and stable and high power output laser beams are produced is realized.

26 Claims, 16 Drawing Sheets position in crystal growth direction

AlGaAs layer thickness (μm)

position in crystal growth direction

SEMICONDUCTOR LASER DEVICE

FIELD OF THE INVENTION

The present invention relates to a semiconductor laser device and a method for fabricating a semiconductor laser device and, more particularly, to a structure of a semiconductor laser device used for optical communication and a fabricating method thereof.

BACKGROUND OF THE INVENTION

In optical communication, direct optical amplification using erbium (Er) doped fiber has been noticed and, as a light source for exciting this Er doped fiber, a semiconductor laser device which oscillates in a 0.98 µm wavelength band has begun to be examined. Laser oscillation in this wavelength band can be realized by a semiconductor laser device that comprises a quantum well active layer laminating well layers comprising InGaAs having a larger lattice constant relative to GaAs and barrier layers comprising AlGaAs in a predetermined layer number. Such a semiconductor laser device which oscillates in the 0.98 µm band and the characteristics thereof are described in, for example, IEEE Journal of Quantum Electronics, Vol. 29, No. 6, June 1993 p1936.

FIG. 12(a) is a perspective view illustrating a structure of a prior art semiconductor laser device, FIG. 12(b) is an enlarged view of a region in the vicinity of the active layer shown by A in FIG. 12(a), and FIG. 12(c) is an energy band diagram of the region in the vicinity of the active layer shown in FIG. 12(b), respectively. In the figures, reference numeral 1 designates an n type GaAs substrate having a thickness of about 350 µm, numeral 2 designates an n type GaAs buffer layer having a thickness of about 1 µm, numeral 3 designates an n type $Al_sGa_{1-s}As$ (s=0.48) lower cladding layer having a thickness of 2~3 µm, and numeral 4 designates a quantum well active layer comprising $Al_yGa_{1-y}As$ (y=0.2) barrier layers (hereinafter, referred to as light guide layers) 4a, $In_xGa_{1-x}As$ (x=0.2) well layers 4b, and an $Al_yGa_{1-y}As$ (y=0.2) barrier layer 4c. This quantum well active layer has a structure in which, as shown in FIG. 12(b), two well layers 4b 80 Å thick are put between two light guide layers 4a 200 Å thick and a barrier layer 4c 80 Å is put between the two well layers 4b. Reference numeral 5 designates a p type $Al_tGa_{1-t}As$ (t=0.48) upper cladding layer having a center portion constituting a part of a ridge structure, and the thickness of the portion including the ridge structure is about 2~3 µm while the thickness of the other portion is about 0.2 µm. Reference numeral 6 designates a p type GaAs first contact layer having a thickness of about 0.2 µm and constituting a part of the ridge structure, disposed on the upper cladding layer 5. Reference numeral 7 designates n type $Al_uGa_{1-u}As$ (u=0.7) current blocking layers disposed so as to bury the ridge structure which is formed by the upper cladding layer 5 and the first contact layer 6. Reference numeral 8 designates a p type GaAs second contact layer having a thickness of about 2 µm and disposed on the current blocking layers 7 and the first contact layer 6. Reference numeral 9 designates a p side electrode disposed on the second contact layer 8 and numeral 10 designates an n side electrode disposed on the rear surface of the semiconductor substrate 1. Reference numeral 11 designates a laser beam emitted from the semiconductor laser device and numeral 17 designates resonator facets of the semiconductor laser device provided perpendicular to the active layer 4. Here, the active layer 4 of the semiconductor laser device has an energy band diagram shown in FIG. 12(c), and this semiconductor laser device oscillates in the 0.98 µm band and has a length in the direction connecting between the laser resonator facets 17 (hereinafter, referred to as resonator length direction) of about 600 µm and a length in the direction perpendicular to the resonator length direction in the plane parallel to the surface of the substrate 1 (hereinafter, referred to as resonator width direction) of about 300 µm. In FIG. 12(c), the ordinate represents the energy band gap, and the abscissa represents the position in the crystal growth direction of respective layers in the vicinity of the active layer 4.

FIGS. 13(a)–13(d) are sectional views illustrating a method for fabricating a prior art semiconductor device. In the figures, the same reference numerals as in FIGS. 12(a) designate the same or corresponding parts, where reference numeral 13 designates an insulating film.

Initially, in the step of FIG. 13(a), on the n type GaAs substrate 1, the n type GaAs buffer layer 2, the n type $Al_sGa_{1-s}As$ (s=0.48) lower cladding layer 3, the quantum well active layer 4, the p type $Al_tGa_{1-t}As$ (t=0.48) upper cladding layer 5, and the p type GaAs first contact layer 6 are successively epitaxially grown.

Subsequently, a stripe shaped insulating film mask 13 extending in what becomes the resonator length direction is formed on the p type GaAs first contact layer 6, and using the insulating film mask 13 as a mask, the p type GaAs first contact layer 6 and the p type $Al_tGa_{1-t}As$ (t=0.48) upper cladding layer 5 are removed by wet etching, whereby a stripe shaped ridge structure extending in what becomes the resonator length direction is formed as shown in FIG. 13(b). Here, in order to precisely control the remaining thickness of the p type upper cladding layer 5 other than the ridge structure in this etching, the etching stopper layer having a different etching rate may be provided at a position at which the etching of the upper cladding layer 5 is to be stopped.

Thereafter, in the step of FIG. 13(c), the n type $Al_uGa_{1-u}As$ (u=0.7) current blocking layers 7 are formed on the upper cladding layer 5 at the opposite sides of the ridge structure so as to bury the ridge structure, and in the step of FIG. 13(d), after removal of the insulating film mask 13, the p type GaAs second contact layer 8 is grown on the p type GaAs first contact layer 6 and the current blocking layers 7. Finally, a p side electrode 9 is formed on the p type GaAs second contact layer 8 and an n side electrode 10 is formed on the rear surface of the n type GaAs substrate 1, and cleaving is performed in the direction perpendicular to the stripe direction of the ridge structure to form the laser resonator facets 17, thereby obtaining the semiconductor laser device as shown in FIG. 12(a).

A description is given of the operation. When a voltage is applied to the laser so that the p side electrode 9 is a positive voltage and the n side electrode 10 is a negative voltage, holes are injected into the active layer 4 through the p type second contact layer 8, the p type first contact layer 6, and the type upper cladding layer 5, and electrons are injected into the active layer 4 through the n type GaAs substrate 1, the n type buffer layer 2, and the n type lower cladding layer 3. The electrons and holes in the active layer 4 generate light by recombination, thereby producing a laser oscillation. Then, the n type current blocking layers 7 are disposed at the opposite sides of the ridge structure and a pnp structure is formed by the p type second contact layer 8, the n type current blocking layer 7, and the p type upper cladding layer 5 so that no current flows there.

The oscillation spectrum of the semiconductor laser device which oscillates in the 0.98 µm band is shown in FIGS. 15(a) and 15(b). In the figures, the ordinate represents light intensity (dB) and the abscissa represents wavelength (in angstroms) of respective modes. When a current is applied to the semiconductor laser device, with a main mode 31 contributing the oscillation wavelength, sub modes 32 are observed as shown in FIG. 15(a). If the observation of the oscillation spectrum is continuously observed while increasing the applied current from this state, a phenomenon that the main mode 31 moves toward the sub mode 32 adjacent the main mode 31 occurs. Here, in FIG. 15(b), reference numeral 31a designates a main mode which has moved. This phenomenon is called mode hop. Usually, the sub modes 32 are related to the laser oscillation wavelength, and in a case of a semiconductor laser device which has a resonator length of about 600 μm and oscillates at 0.78 μm band, the sub modes 32 are observed at intervals of approximately 2 Å. However, the interval of the sub modes shown in FIGS. 15 amounts to about ten times of the above-described interval, i.e., 20 Å. Therefore, the mode hop of the semiconductor laser device which oscillates at the 0.78 μm band is generated in a range of ±2 Å from the main mode while the mode hop of the semiconductor laser device which oscillates in the 0.98 μm band is generated in a range of ±20 Å.

The relation between the light output and the current (light output—current characteristic) of the prior art semiconductor laser device which oscillates in 0.98 μm band is shown in FIG. 16. In FIG. 16, reference numeral 33 designates a kink. The ordinate represents light output (mW) and the abscissa represents current (mA), respectively. As shown in FIG. 16, the semiconductor laser device which oscillates in the 0.98 μm band has a lot of discontinuous regions like kink 33. As a result of investigations by the inventors of the present invention, it is found that these kinks 33 correspond to the mode hops described above. In a usual semiconductor laser device which oscillates at the 0.78 μm band, even when there occurs a mode hop between modes, the interval between the modes is narrow to be about 2 Å as described above, whereby no kinks 33 are generated. On the other hand, in the semiconductor laser device which oscillates in 0.98 μm band, since there occurs a mode hop having a 20 Å band as described above, kinks 33 are generated. The generation of these kinks 33 makes it difficult to stably obtain high power output laser beams and to introduce the high power output laser beams into an optical fiber, thereby making the excitation efficiency Er in the optical fiber unstable.

FIG. 14(a) is a perspective view illustrating a structure of another prior art semiconductor laser device, FIG. 14(b) is an enlarged view illustrating a region in the vicinity of the active layer shown by C in FIG. 14(a), and FIG. 14(c) is an energy band diagram of a region in the vicinity of the active layer shown in FIG. 14(b), respectively, where the semiconductor laser device oscillates at the 0.78 μm band. In the figures, the same reference numerals as in FIGS. 12(a)–12(c) designate the same or corresponding parts. Reference numeral 12 designates a laser beam emitted from the resonator facet 17, and numeral 14 designates a quantum well active layer comprising $Al_{0.35}Ga_{0.65}As$ light guide layers 14a, $Al_{0.1}Ga_{0.9}As$ well layers 14b, and $Al_{0.35}Ga_{0.65}As$ barrier layers 14c. As shown in FIG. 14(b), the quantum well active layer 14 has a structure in which three well layers 14b 80 Å thick are put between two light guide layers 14a 200 Å thick with two barrier layers 14c 80 Å thick inserted between three well layers 14b, whereby the active layer 14 has the energy band diagram as shown in FIG. 14(c). Besides, in FIG. 14(c), the ordinate represents the energy band gap and the abscissa represents the position in the crystal growth direction of respective layers in the vicinity of the active layer 14.

Next, a cause of a large mode hop generated in the semiconductor laser device which oscillates in the 0.98 μm band will be described. In the semiconductor laser device which oscillates at 0.78 μm as shown in FIG. 14(a), the substrate 1, the first contact layer 6, and the second contact layer 8 comprise GaAs, and the energy band gap thereof is converted into a wavelength of 0.87 μm. Therefore, among the laser beams advancing in the semiconductor laser device which oscillates in the 0.78 μm band in a direction other than the direction parallel to the laser resonator length direction, the laser beams advancing in the directions of the p side electrode and the n side electrode 10 are absorbed by the substrate 1, the first contact layer 6, and the second contact layer 8. On the other hand, in the semiconductor laser device which oscillates in the 0.98 μm band as shown in FIG. 12(a), since the laser beams emitted from the laser resonator facet 17 have an energy band gap narrower than a value of 0.87 μm, which corresponds to the energy band gap of the substrate 1, the first contact layer 6, and the second contact layer 8 which are constituted by GaAs, and therefore, the laser beams are easily transmitted the substrate 1, the first contact layer 6, and the second contact layer 8. The transmitted laser beams reach the p side electrode 9 and the n side electrode 10 and are reflected thereat. As a result, the laser beams resonate between the p side electrode 9 and the n side electrode 10 perpendicular to the resonator length direction, and a sub modes 32 of about 20 Å spacing having a wide mode interval are generated. This causes a large mode hop and the kinks 33 are generated.

By the way, such kinks are generated also in a semiconductor laser device that has a quantum well active layer including InGaAs well layers and AlGaAs barrier layers, i.e., that can produce an oscillation wavelength of 0.9~1.2 μm band. It is because the laser beams of 0.9~1.2 μm wavelength are not absorbed by a semiconductor substrate, the first contact layer, and a second contact layer, all comprising GaAs and in the direction other than the direction parallel to the laser resonator length direction, that the laser beams resonate between the p side electrode and the n side electrode, and a large mode hop occurs as described above.

As described above, in the prior art semiconductor laser device oscillating in the 0.9~1.2 μm band that has a quantum well active layer including InGaAs well layers and AlGaAs barrier layers, especially, having an oscillation wavelength of 0.98 μm, the laser beams are not absorbed by the semiconductor substrate, the first and the second contact layers, and in a direction other than the direction parallel with the laser resonator length direction, the laser beams resonate between the p side electrode and the n side electrode, and there arise sub modes having wide mode interval. There also arises mode hop in the sub modes, kinks are generated and it becomes difficult to generate high power output laser beams stably. As a result, the high output laser beams cannot be stably introduced into the optical fiber and the excitation efficiency of Er in the fiber is unstable.

SUMMARY OF THE INVENTION

It is an object of the present invention to provide a semiconductor laser device that has suppressed generation of large mode hops and that can obtain stable and high output laser beams having fewer kinks.

It is another object of the present invention to provide a method for fabricating a semiconductor laser device that has suppressed generation of large mode hops and that can produce stable and high power output laser beams having less kinks.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device includes a first conductivity type GaAs substrate having opposed front and rear surfaces, a first conductivity type GaAs buffer layer disposed on the front surface of the first conductivity type GaAs substrate, a first conductivity type $Al_sGa_{1-s}As$ (0<s<1) cladding layer disposed on the first conductivity type GaAs buffer layer, a quantum well active layer having a material composition, thickness, and layer number that can obtain an oscillation wavelength of 0.9~1.2 μm band and including a well layer comprising $In_xGa_{1-x}As$ (0<x<1) and a barrier layer comprising $Al_yGa_{1-y}As$ (0<y<s), disposed on the first conductivity type cladding layer, a second conductivity type $Al_tGa_{1-t}As$ (1<t<y) upper cladding layer disposed on the active layer, a second conductivity type GaAs contact layer disposed on the second conductivity type upper cladding layer, and a multiple reflection film layer alternatingly laminating a first and a second semiconductor materials which have the same conductivity type as the adjacent semiconductor materials and have the different refractive indices to a predetermined number of layers, respectively, disposed parallel with the active layer so as not to be in contact with the active layer at a position of predetermined height against the active layer, a first electrode disposed on the rear surface of the semiconductor substrate, a second electrode disposed on the second conductivity type contact layer, and a pair of laser resonator facets provided perpendicular to the active layer and the multiple reflection film layer. Therefore, the laser beams advancing in the electrode direction among the laser beams advancing in the direction different from the laser resonator length direction in the semiconductor laser device, i.e., in the direction different from the direction perpendicular to the resonator facet can be reflected by the multiple reflection film before reaching the substrate, and the wavelength interval between the main mode and the sub mode can be narrowed, whereby generation of large mode hops are dispensed with and the generation of kinks are suppressed.

According to a second aspect of the present invention, in the above-described semiconductor laser device, the first semiconductor material is AlAs, and the second semiconductor material is GaAs. Therefore, the laser beams advancing in the electrode direction among the laser beams advancing in the direction different from the laser resonator length direction in the semiconductor laser device can be reflected by the multiple reflection film disposed at a position closer to the active layer than to the electrode, whereby the generation of kinks are suppressed.

According to a third aspect of the present invention, in the above-described semiconductor laser device, the upper portion of the second conductivity type cladding layer and the lower portion of the second conductivity type contact layer form a stripe shaped ridge structure extending perpendicular to the resonator facets, and first conductivity type $Al_uGa_{1-u}As$ (t<u<1) current blocking layers are disposed at the opposite sides of the ridge structure so as to bury the ridge structure. Therefore, the laser beams advancing in the electrode direction among the laser beams advancing in the direction different from the laser resonator length direction in the semiconductor laser device can be reflected by the multiple reflection film disposed at a position closer to the active layer than to the electrode, whereby the generation of kinks are suppressed.

According to a fourth aspect of the present invention, in the above-described semiconductor laser device, the active layer has a material composition, thickness, and layer number that can obtain the oscillation wavelength of 0.98 μm. Therefore, the laser beams advancing in the electrode direction among the laser beams advancing in the direction different from the laser resonator length direction in the semiconductor laser device can be reflected by the multi-reflecting film layer disposed at a position closer to the active layer than to the electrode, whereby the generation of kinks can be suppressed.

According to a fifth aspect of the present invention, in the above-described semiconductor device, the multiple reflection film layer is disposed at a position of a predetermined height in the contact layer. Therefore, the laser beams advancing in the electrode direction among the laser beams advancing in the direction different from the laser resonator length direction in the semiconductor laser device can be reflected by the multi-reflecting film layer disposed at a position closer to the active layer than to the electrode, whereby the generation of kinks can be suppressed.

According to a sixth aspect of the present invention, a semiconductor laser device includes a first conductivity type GaAs substrate having opposed front and rear surfaces, a first conductivity type GaAs buffer layer disposed on the front surface of the first conductivity type GaAs substrate, a first conductivity type $Al_sGa_{1-s}As$ (0<s<1) cladding layer disposed on the first conductivity type GaAs buffer layer, a quantum well active layer having a material composition, thickness, and layer number that can obtain an oscillation wavelength of 0.9~1.2 μm band and including a well layer comprising $In_xGa_{1-x}As$ (0<x<1) and a barrier layer comprising $Al_yGa_{1-y}As$ (0<y<s), disposed on the first conductivity type cladding layer, a second conductivity type $Al_tGa_{1-t}As$ (y<t<1) cladding layer, a second conductivity type contact layer disposed on the second conductivity type cladding layer, a first electrode disposed on the rear surface of the semiconductor substrate, a second electrode disposed on the second conductivity type contact layer, and a pair of resonator facets provided perpendicular to the active layer. One of the semiconductor substrate, the buffer layer, and the contact layer is provided with a layer comprising a material absorbing laser beams generated in the active layer at a predetermined height and the other layers are GaAs. Therefore, the laser beams advancing in the electrode direction among the laser beams advancing in the direction different from the laser resonator length direction in the semiconductor laser device can be absorbed by a layer comprising a material absorbing the laser beams, whereby the oscillation of laser beams between the electrodes can be reduced and the generation of a large mode hop can be dispensed with and the generation of kinks can be suppressed.

According to a seventh embodiment of the present invention, in the above-described semiconductor device, the entire layer including a layer comprising a material absorbing laser beams comprises a material absorbing laser beams. Therefore, the laser beams advancing in the electrode direction among the laser beams advancing in the direction different from the laser resonator length direction in the semiconductor laser device can be absorbed by a layer comprising a material absorbing the laser beams, whereby the oscillation of laser beams between the electrodes can be reduced and the Generation of a large mode hop can be dispensed with and the Generation of kinks can be suppressed.

According to an eighth aspect of the present invention, in the above-described semiconductor laser device, an upper portion of the second conductivity type cladding layer and a lower portion of the second conductivity type contact layer form a ridge structure extending perpendicular to the resonator facets, and first conductivity type $Al_uGa_{1-u}As$ (t<u<1) current blocking layers are provided at the opposite sides of the ridge structure so as to bury the ridge structure. Therefore, the oscillation of the laser beams between the electrodes can be reduced and the generation of kinks can be suppressed.

According to a ninth aspect of the present invention, in the above-described semiconductor laser device, the active layer has material composition, thickness, and layer number that can obtain the oscillation wavelength of 0.98 μm band. Therefore, the oscillation of the laser beams between the electrodes can be reduced and the generation of kinks can be suppressed.

According to a tenth aspect of the present invention, in the above-described semiconductor laser device, the layer comprising a material absorbing the laser beams is the contact layer and the material thereof is Ge (germanium). Therefore, the laser beams advancing in the electrode direction among the laser beams advancing in the direction different from the laser resonator length direction in the semiconductor laser device can be absorbed by a layer comprising a material absorbing the laser beams, whereby the oscillation of laser beams between the electrodes can be reduced and the generation of a large mode hop can be dispensed with and the generation of kinks can be suppressed.

According to an eleventh aspect of the present invention, in the above-described semiconductor laser device, the layer comprising a material absorbing the laser beams is the semiconductor substrate and the material thereof is silicon (Si). Therefore, the laser beams advancing in the electrode direction among the laser beams advancing in the direction different from the laser resonator length direction in the semiconductor laser device can be absorbed by the Si substrate, and the oscillation of laser beams between electrodes can be reduced, the generation of large mode hops can be dispensed with and the generation of kinks can be suppressed.

According to a twelfth aspect of the present invention, in the above-described semiconductor laser device, the layer comprising the material absorbing the laser beams is the contact layer and the material thereof is $In_vGa_{1-v}As$ (0.2<v). Therefore, the laser beams advancing in the electrode direction among the laser beams advancing in the direction different from the laser resonator length direction in the semiconductor laser device can be absorbed by the $In_vGa_{1-v}As$ (v>0.2) contact layer, whereby the oscillation of laser beams between the electrodes can be reduced and the generation of a large mode hop can be dispensed with and the generation of kinks can be suppressed.

According to a thirteenth aspect of the present invention, a semiconductor laser device comprises a first conductivity type GaAs substrate having opposed front and rear surfaces, a first conductivity type GaAs buffer layer disposed on the front surface of the first conductivity type GaAs substrate, a first conductivity type $Al_sGa_{1-s}As$ (0<s<1) cladding layer disposed on the first conductivity type GaAs buffer layer, a quantum well active layer having material composition, thickness, and layer number that can obtain an oscillation wavelength of 0.9–1.2 μm band and including a well layer comprising $In_xGa_{1-x}As$ (0<x<1) and a barrier layer comprising $Al_yGa_{1-y}As$ (0<y<s), disposed on the first conductivity type cladding layer, a second conductivity type $Al_tGa_{1-t}As$ (y<t<1) cladding layer, a second conductivity type GaAs contact layer disposed on the second conductivity type cladding layer, a critical film thickness layer laminated structure alternatingly laminating a layer having large strain against the substrate, having a thickness less than the critical film thickness, and comprising a material absorbing laser beams, and a layer having small strain against the substrate at a position of a predetermined height against the active layer so as not to be in contact with the active layer and to be parallel with the active layer, and having the same conductivity type as that of the adjacent layers, a first electrode disposed on the rear surface of the GaAs substrate, a second electrode disposed on the upper surface of the contact layer, and a pair of resonator facets provided so as to be perpendicular to the active layer. Therefore, the laser beams advancing in the electrode direction among the laser beams advancing in the direction different from the laser resonator length direction in the semiconductor laser device can be absorbed by a plurality of layers comprising a material absorbing the laser beams of the critical film thickness layer laminated structure, whereby the oscillation of laser beams between the electrodes can be reduced and the generation of a large mode hop can be dispensed with and the generation of kinks can be suppressed. In addition, the layer comprising the material which absorbs the laser beams having a large strain for the substrate is used as the layer absorbing the laser beams.

According to a fourteenth aspect of the present invention, in the above described semiconductor laser device, the layer having small stress is $Al_wGa_{1-w}As$ (w>0) layer and the layer having large strain is an $In_zGa_{1-z}As$ (z>0.2) layer. Therefore, the laser beams advancing in the electrode direction among the laser beams advancing in the direction different from the laser resonator length direction in the semiconductor laser device can be absorbed by the $In_zGa_{1-z}As$ (z>0.2) layer, whereby the oscillation of laser beams between the electrodes can be reduced and the generation of a large mode hop can be dispensed with and the generation of kinks can be suppressed.

According to a fifteenth aspect of the present invention, in the above described semiconductor laser device, the upper portion of the second conductivity type cladding layer and the lower portion of the second conductivity type contact layer form a stripe shaped ridge structure extending perpendicular to the resonator facets, and first conductivity type $Al_uGa_{1-u}As$ (s<u<1) current blocking layers are provided at the opposite sides of the ridge structure so as to bury the ridge structure. Therefore, the oscillation of the laser beams between the electrodes can be reduced and the generation of kinks can be suppressed.

According to a sixteenth aspect of the present invention, in the above-described semiconductor laser device, the active layer has material composition, thickness, and layer number that can obtain the oscillation wavelength of 0.98 μm band. Therefore, the oscillation of the laser beams between the electrodes can be reduced and the generation of kinks can be suppressed.

According to a seventeenth aspect of the present invention, the above-described semiconductor laser device comprises a first conductivity type GaAs substrate having opposed front and rear surfaces, a first conductivity type GaAs buffer layer disposed on the front surface of the first conductivity type GaAs substrate, a first conductivity type $Al_sGa_{1-s}As$ (0<s<1) cladding layer disposed on the first conductivity type GaAs buffer layer, a quantum well active layer having material composition, thickness, and layer number that can obtain an oscillation wavelength of 0.9~1.2 μm band and including a well layer comprising $In_xGa_{1-x}As$ (0<x<1) and a barrier layer comprising $Al_yGa_{1-y}As$ (0<y<s), disposed on the first conductivity type cladding layer, a second conductivity type $Al_tGa_{1-t}As$ (y<t<1) cladding layer comprising $In_rGa_{1-r}P$ having a thickness of larger than 4 μm on the light emitting region of the active layer and having an In composition ratio so as to have the lattice constant the same as that of the first conductivity type GaAs substrate, disposed on the quantum well active layer, a second conductivity type contact layer disposed on the second conductivity type cladding layer, a first electrode disposed on the rear surface of the semiconductor substrate, a second electrode disposed on the second conductivity type semiconductor layer, and a pair of resonator facets provided perpendicular to the active layer. Therefore, the laser beams reaching the electrode are reduced, the oscillation of the laser beams between the electrodes can be reduced, and the generation of kinks can be suppressed, as well as degradation of lifetime of the semiconductor laser device is prevented.

According to an eighteenth aspect of the present invention, in the above-described semiconductor laser device, the In composition ratio r of the second conductivity type cladding layer is 0.51. Therefore, the laser beams reaching the electrode are reduced, the oscillation of the laser beams between the electrodes can be reduced, and the Generation of kinks can be suppressed, as well as degradation of lifetime of the semiconductor laser device is prevented.

According to a nineteenth aspect of the present invention, in the above-described semiconductor laser device comprises an upper portion of the second conductivity type cladding layer and a lower portion of the second conductivity type contact layer form a ridge structure extending perpendicular to the resonator facets, and first conductivity type $Al_uGa_{1-u}As$ (t<u<1) current blocking layers in which the Al composition ratio u is adjusted so as to have a band gap energy that is larger than that of the $In_rGa_{1-r}P$ upper cladding layer are provided at the opposite sides of the ridge structure so as to bury the ridge structure. Therefore, the laser beams reaching the electrode are reduced, the oscillation of the laser beams between the electrodes can be reduced, and the generation of kinks can be suppressed, as well as degradation of lifetime of the semiconductor laser device is prevented.

According to a twentieth aspect of the present invention, in the above-described semiconductor laser device, the active layer has material composition, thickness, and layer number that can obtain the oscillation wavelength of 0.98 μm band. Therefore, the laser beams reaching the electrode are reduced, the oscillation of the laser beams between the electrodes can be reduced, and the generation of kinks can be suppressed, as well as degradation of lifetime of the semiconductor laser device is prevented.

According to a twenty-first aspect of the present invention, a method for fabricating a semiconductor laser device comprises preparing a first conductivity type GaAs substrate having opposed front and rear surfaces, epitaxially growing, on the front surface of the first conductivity type GaAs substrate, successively a first conductivity type GaAs buffer layer, a first conductivity type $Al_sGa_{1-s}As$ (0<s<1) cladding layer, a quantum well active layer having material composition, thickness, and layer number that can obtain an oscillation wavelength of 0.9~1.2 μm band and including a well layer comprising $In_xGa_{1-x}As$ (0<x<1) and a barrier layer comprising $Al_yGa_{1-y}As$ (0<y<s), a second conductivity type $Al_tGa_{1-t}As$ (y<t<1) cladding layer, and a first second conductivity type GaAs contact layer, etching the first second conductivity type contact layer and the second conductivity type cladding layer to a depth not reaching the active layer using the stripe shaped insulating film extending in a predetermined direction and formed on the first contact layer as a mask to form a ridge structure, epitaxially growing a first conductivity type $Al_uGa_{1-u}As$ (t<u<1) current blocking layer on a portion of the second conductivity type cladding layer exposed by etching so as to bury the ridge structure, after removing the insulating mask, successively growing, on the current blocking layer and on the first second conductivity type cladding layer, a second second conductivity type GaAs contact layer, a multiple reflection film layer alternatingly laminating second conductivity type first and second semiconductor materials having different refractive indices to a predetermined number of layers, and a third second conductivity type GaAs contact layer, forming a first electrode on the rear surface of the GaAs substrate, forming a second electrode on a surface of the GaAs contact layer, and performing cleavage in planes perpendicular to the direction in which the stripe of the ridge structure extends, thereby forming a pair of resonator facets. Therefore, the laser beams advancing in the electrode direction among the laser beams advancing in the direction different from the laser resonator length direction in the semiconductor laser device, i.e., in the direction different from the direction perpendicular to the resonator facet can be reflected by the multiple reflection film disposed at a position closer to the active layer than to the electrode, and the wavelength interval between the main mode and the sub mode can be narrowed, whereby generation of large mode hops are dispensed with and the generation of kinks are suppressed.

According to a twenty-second aspect of the present invention, a method for fabricating a semiconductor laser device comprises preparing a first conductivity type GaAs substrate having opposed front and rear surfaces, epitaxially growing, on the front surface of the first conductivity type GaAs substrate, successively a first conductivity type GaAs buffer layer, a first conductivity type $Al_sGa_{1-s}As$ (0<s<1) cladding layer, a quantum well active layer having a material composition, thickness, and layer number that can obtain an oscillation wavelength of 0.9~1.2 μm band and including a well layer comprising $In_xGa_{1-x}As$ (0<x<1) and a barrier layer comprising $Al_yGa_{1-y}As$ (0<y<s), a second conductivity type $Al_tGa_{1-t}As$ (y<t<1) cladding layer, and a first second conductivity type GaAs contact layer, etching the first second conductivity type contact layer and the second conductivity type cladding layer to a depth not reaching the active layer using the stripe shaped insulating film extending in a predetermined direction and formed on the first contact layer as a mask to form a ridge structure, epitaxially growing a first conductivity type $Al_uGa_{1-u}As$ (t<u<1) current blocking layer on a portion of the second conductivity type cladding layer exposed by etching so as to bury the ridge structure, after removing the insulating mask, growing a contact layer comprising Ge on the current blocking layer and on the first second conductivity type cladding layer, forming a first electrode on the rear surface of the GaAs substrate, forming a second electrode on a surface of the contact layer, and performing cleavage in planes perpendicular to the direction in which the stripe of the ridge structure extends, thereby forming a pair of resonator facets. Therefore, the laser beams advancing in the electrode direction among the laser beams advancing in the direction different from the laser resonator length direction in the semiconductor laser device can be absorbed by a Ge contact layer, whereby the oscillation of laser beams between the electrodes can be reduced and the generation of a large mode hop can be dispensed with and the generation of kinks can be suppressed.

According to a twenty-third aspect of the present invention, a method for fabricating a semiconductor laser device comprises preparing a second conductivity type GaAs substrate having opposed front and rear surfaces, epitaxially growing, on the front surface of the second conductivity type GaAs substrate, a first conductivity type $Al_uGa_{1-u}As$ (0<u<1) current blocking layer, etching the current blocking layer up to reaching the GaAs substrate using an insulating film having a stripe shaped aperture extending in a predetermined direction formed on the current blocking layer, forming a first second conductivity type GaAs contact layer and a first second conductivity type $Al_tGa_{1-t}As$ (0<t<u) cladding layer so as to bury the stripe shaped groove formed by the etching, after removing the insulating film, epitaxially growing, on the current blocking layer and on the first second conductivity type cladding layer, a second conductivity type $Al_tGa_{1-t}As$ (0<t<u) cladding layer, a quantum well active layer having material composition, thickness, and layer number that can obtain an oscillation wavelength of 0.9–1.2 μm band and including a well layer comprising $In_xGa_{1-x}As$ (0<x<1), and a barrier layer comprising $Al_yGa_{1-y}As$ (0<y<s), a first conductivity type $Al_sGa_{1-s}As$ (y<s<1) cladding layer, and a first conductivity type GaAs buffer layer, fixing the first conductivity type Si substrate onto the first conductivity type buffer layer by placing the first conductivity type Si substrate on the first conductivity type buffer layer and heating the Si substrate and the respective layers, forming a first electrode on an opposed surface of the first conductivity type Si substrate to which the buffer layer is adhered, forming a second electrode on the rear surface of the second conductivity type GaAs substrate, and performing cleavage in planes perpendicular to the direction in which the stripe of the ridge structure extends, thereby forming a pair of resonator facets. Therefore, the laser beams advancing in the electrode direction among the laser beams advancing in the direction different from the laser resonator length direction in the semiconductor laser device can be absorbed by an Si substrate, whereby the oscillation of laser beams between the electrodes can be reduced and the generation of a large mode hop can be dispensed with and the generation of kinks can be suppressed.

According to a twenty-fourth aspect of the present invention, a method for fabricating a semiconductor laser device comprises preparing a first conductivity type GaAs substrate having opposed front and rear surfaces, epitaxially growing, on the front surface of the first conductivity type GaAs substrate, successively a first conductivity type GaAs buffer layer, a first conductivity type $Al_sGa_{1-s}As$ (0<s<1) cladding layer, a quantum well active layer having material composition, thickness, and layer number that can obtain an oscillation wavelength of 0.9–1.2 μm band and including a well layer comprising $In_xGa_{1-x}As$ (0<x<1) and a barrier layer comprising $Al_yGa_{1-y}As$ (0<y<s), a second conductivity type $Al_tGa_{1-t}As$ (y<t<1) cladding layer, and a first second conductivity type GaAs contact layer, etching the first second conductivity type contact layer and the second conductivity type cladding layer to a depth not reaching the active layer using the stripe shaped insulating film extending in a predetermined direction formed on the first contact layer as a mask to form a ridge structure, epitaxially growing a first conductivity type $Al_uGa_{1-u}As$ (t<u<1) current blocking layer on a portion of the second conductivity type cladding layer exposed by etching so as to bury the ridge structure, after removing the insulating mask, growing, on the current blocking layer and on the first second conductivity type cladding layer, a contact layer comprising $In_vGa_{1-v}As$ (0.2<v) in which the In composition ratio v is adjusted so as to absorb the laser beams generated from the active layer, forming a first electrode on the rear surface of the GaAs substrate, forming a second electrode on a surface of the contact layer, and performing cleavage in planes perpendicular to the direction in which the stripe of the ridge structure extends, thereby forming a pair of resonator facets. Therefore, the laser beams advancing in the electrode direction among the laser beams advancing in the direction different from the laser resonator length direction in the semiconductor laser device can be absorbed by an $In_vGa_{1-v}As$ (0.2<v) contact layer, whereby the oscillation of laser beams between the electrodes can be reduced and the generation of a large mode hop can be dispensed with and the generation of kinks can be suppressed.

According to a twenty-fifth aspect of the present invention, a method for fabricating a semiconductor laser device comprises preparing a first conductivity type GaAs substrate having opposed front and rear surfaces, epitaxially growing, on the front surface of the first conductivity type GaAs substrate, successively a first conductivity type GaAs buffer layer, a first conductivity type $Al_sGa_{1-s}As$ (0<s<1) cladding layer, a quantum well active layer having material composition, thickness, and layer number that can obtain an oscillation wavelength of 0.9–1.2 μm band and including a well layer comprising $In_xGa_{1-x}As$ (0<x<1) and a barrier layer comprising $Al_yGa_{1-y}As$ (0<y<s), a second conductivity type $Al_tGa_{1-t}As$ (y<t<1) cladding layer, and a first second conductivity type GaAs contact layer, etching the first second conductivity type contact layer and the second conductivity type cladding layer to a depth not reaching the active layer using the stripe shaped insulating film extending in a predetermined direction formed on the first contact layer as a mask to form a ridge structure, epitaxially growing a first conductivity type $Al_uGa_{1-u}As$ (t<u<1) current blocking layer on a portion of the second conductivity type cladding layer exposed by etching so as to bury the ridge structure, after removing the insulating mask, successively growing, on the current blocking layer and on the first second conductivity type cladding layer, a second second conductivity type GaAs contact layer, a critical film thickness enlarging layer, laminating a layer having large strain against the substrate, having a thickness less than the critical film thickness, and comprising a material absorbing laser beams, and a layer having small strain against the substrate alternatively, and a third second conductivity type GaAs contact layer, forming a first electrode on the rear surface of the GaAs substrate, forming a second electrode on a surface of the GaAs contact layer, and performing cleavage in planes perpendicular to the direction in which the stripe of the ridge structure extends, thereby forming a pair of resonator facets. Therefore, the laser beams advancing in the electrode direction among the laser beams advancing in the direction different from the laser resonator length direction in the semiconductor laser device can be absorbed by a plurality of layers comprising a material absorbing the laser beams of the critical film thickness layer laminated structure, whereby the oscillation of laser beams between the electrodes can be reduced and the generation of a large mode hop can be dispensed with and the generation of kinks can be suppressed. In addition, the layer having a large strain is used as the layer absorbing the laser beams.

According to a twenty-sixth aspect of the present invention, a method for fabricating a semiconductor laser device comprises preparing a first conductivity type GaAs substrate having opposed front and rear surfaces, epitaxially growing, on the front surface of the first conductivity type GaAs substrate, successively a first conductivity type GaAs buffer layer, a first conductivity type $Al_sGa_{1-s}As$ (0<s<1) cladding layer, a quantum well active layer having material composition, thickness, and layer number that can obtain an oscillation wavelength of 0.9~1.2 μm band and including a well layer comprising $In_xGa_{1-x}As$ (0<x<1) and a barrier layer comprising $Al_yGa_{1-y}As$ (0<y<s), a second conductivity type $Al_tGa_{1-t}As$ (y<t<1) cladding layer, and a first second conductivity type GaAs contact layer, etching the first second conductivity type contact layer and the second conductivity type cladding layer to a depth not reaching the active layer using the stripe shaped insulating film extending in a predetermined direction formed on the first contact layer as a mask to form a ridge structure, epitaxially growing a first conductivity type $Al_uGa_{1-u}As$ (0<u<1) current blocking layer in which Al composition ratio is adjusted so as to have a band gap energy larger than that of the second conductivity type cladding layer on a portion of the second conductivity type cladding layer exposed by etching so as to bury the ridge structure, after removing the insulating mask, growing, on the current blocking layer and on the first second conductivity type cladding layer, a second conductivity type GaAs contact layer, forming a first electrode on the rear surface of the GaAs substrate, forming a second electrode on a surface of the GaAs contact layer, and performing cleavage in planes perpendicular to the direction in which the stripe of the ridge structure extends, thereby forming a pair of resonator facets. Therefore, the oscillation of laser beams between the electrodes can be reduced and the generation of a large mode hop can be dispensed with and the generation of kinks can be suppressed, as well as degradation of lifetime of the semiconductor laser device is prevented.

DETAILED DESCRIPTION OF THE PREFERRED EMBODIMENTS

Embodiment 1

Figure 1:
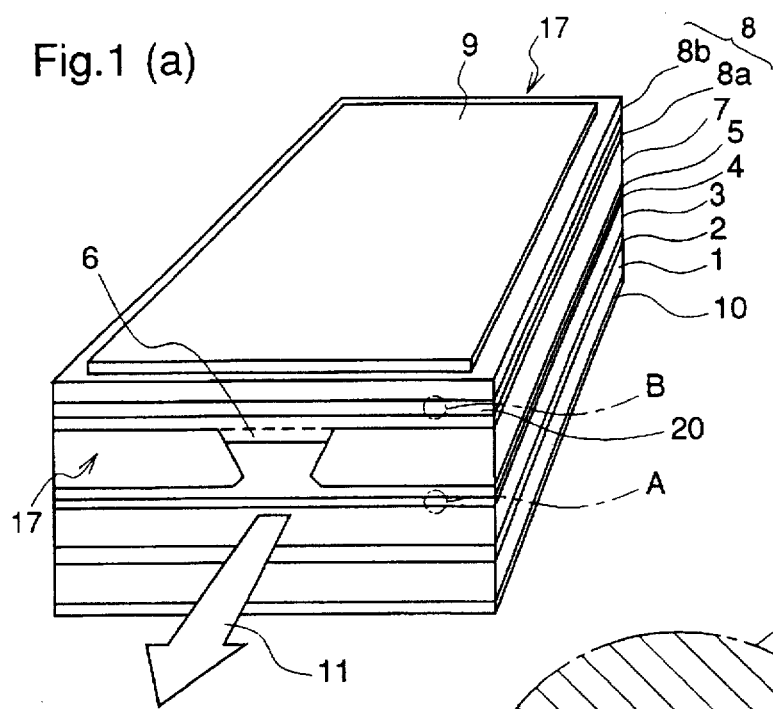
FIG. 1(a) is a perspective view illustrating a semiconductor laser device according to a first embodiment of the present invention and FIGS. 1(b) and 1(c) are enlarged views illustrating main parts of the semiconductor laser device.
Figure 1:
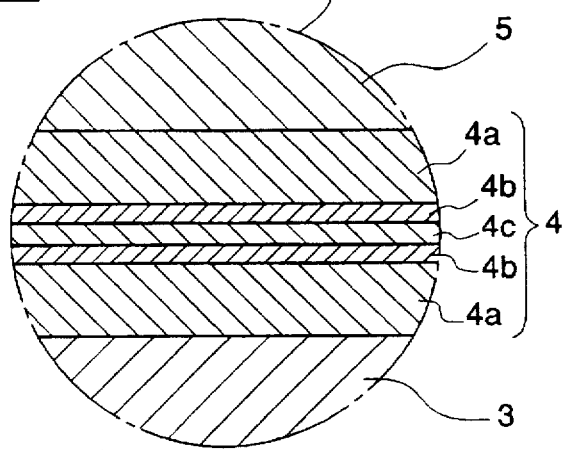
Figure 1:
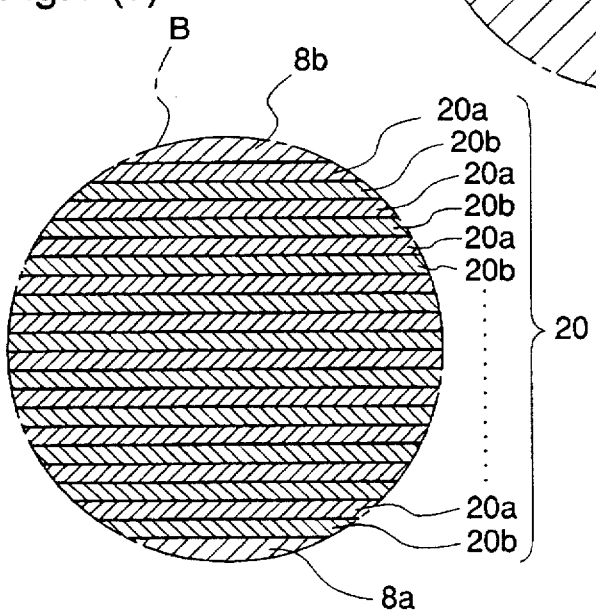

FIG. 1(a) is a perspective view illustrating a structure of a semiconductor laser device according to a first embodiment of the present invention, FIG. 1(b) is an enlarged view of a region in the vicinity of an active layer shown by A in FIG. 1(a), and FIG. 1(c) is an enlarged view of a region in the vicinity of a multiple reflection film layer shown by B in FIG. 1(a), respectively. In the figures, reference numeral 1 designates an n type GaAs substrate having a thickness of about 350 μm, numeral 2 designates an n type GaAs buffer layer having a thickness of about 1 μm, numeral 3 designates an n type $Al_sGa_{1-s}As$ (s=0.48) lower cladding layer 2~3 μm thick, and numeral 4 designates a quantum well active layer comprising $Al_yGa_{1-y}As$ (y=0.2) barrier layers (hereinafter, referred to as light guide layers) 4a, $In_xGa_{1-x}As$ (x=0.2) well layers 4b, and an $Al_yGa_{1-y}As$ (y=0.2) barrier layer 4c. This quantum well active layer 4 has a structure in which, as shown in FIG. 1(b), two well layers 4b 80 Å thick are put between two light guide layers 4a 200 Å thick and a barrier layer 4c 80 Å is put between two well layers 4b. In a quantum well active layer 4 including $In_xGa_{1-x}As$ (x>0) well layers, the laser beams having an oscillation wavelength of 0.9~1.2 μm can be obtained due to a combination of In composition ratio x, layer thickness, and layer number, especially, according to the first embodiment, laser beams having an oscillation wavelength of 0.98 μm can be obtained. Reference numeral 5 designates a p type Al$_t$Ga$_{1-t}$As (t=0.48) upper cladding layer having a center portion constituting a part of a ridge structure, where the thickness of a portion including the ridge structure is about 2 μm while the thickness of the other portion is about 0.2 μm. Reference numeral 6 designates a p type GaAs first contact layer having a thickness of about 0.2 μm and constituting an upper part of the ridge structure, disposed on the upper cladding layer 5. Reference numeral 7 designates n type Al$_u$Ga$_{1-u}$As (u=0.7) current blocking layers disposed so as to bury the ridge structure which is formed by the upper cladding layer 5 and the first contact layer 6. Reference numeral 8 designates a p type GaAs second contact layer having a thickness of about 2 μm and comprising a first p type GaAs second contact layer 8a and a second p type GaAs second contact layer 8b, disposed on the current blocking layers 7 and the first contact layer 6, in which a multiple reflection film layer 20 is provided between the first second contact layer 8a and the second second contact layer 8b. Reference numeral 20a designates a p type AlAs layer and numeral 20b designates a p type GaAs layer. Reference numeral 9 designates a p side electrode disposed on the second contact layer 8 and numeral 10 designates an n side electrode disposed on the rear surface of the semiconductor substrate 1. Reference numeral 11 designates a laser beam having a wavelength of 0.98 μm and numeral 17 designates resonator facets of the semiconductor laser device provided perpendicular to the active layer 4. The semiconductor laser device in the first embodiment has a length in the direction connecting the laser resonator facets 17 (hereinafter, referred to as resonator length direction) of about 600 μm and a length in the direction perpendicular to the resonator length direction in the plane parallel to the surface of the substrate 1 (hereinafter, referred to as resonator width direction) of about 300 μm, respectively.

FIGS. 2(a)–2(d) are sectional views illustrating a method for fabricating the semiconductor device according to the first embodiment of the present invention. In the figures, the same reference numerals as in FIGS. 1(a) designate the same or corresponding parts, where reference numeral 13 designates an insulating film.

In the multiple reflection film layer 20, first materials g and second materials h, each having a different refractive index, are alternatingly laminated so as to be several tens of layers by the following formulae, i.e., thicknesses as $$d_g = \lambda/4n_g$$

$$d_h = \lambda/4n_h$$

where λ is a wavelength of incident light, n$_g$ is a refractive index for wavelength λ of material g, n$_h$ is a refractive index for wavelength λ of material h, d$_g$ is a thickness of material g, and d$_h$ is a thickness of material h. Therefore, the laser beams incident on the multiple reflection film layer 20 are reflected by this structure. According to the first embodiment, as shown in FIG. 1(c), the multiple reflection film layer 20 alternatingly laminating about twenty p type AlAs layers 20a having a relatively small refractive index and about twenty p type GaAs layers 20b having a relatively large refractive index is employed. The thickness of each layer is represented by $$d_{AlAs} = \lambda/4n_{AlAs}$$

$$d_{GaAs} = \lambda/4n_{GaAs}$$

where λ is a wavelength 0.98 μm of incident light, n$_{AlAs}$ is a refractive index for wavelength λ of AlAs, n$_{GaAs}$ is a refractive index for wavelength λ of GaAs, d$_{AlAs}$ is a thickness of AlAs, and d$_{GaAs}$ is a thickness of GaAs.

This multiple reflection film layer 20 is one example, and any other materials may be employed for the multiple reflection film layer 20 as long as the materials satisfy the thickness formulas above, and the layer number may be increased or decreased as needed.

Figure 2:
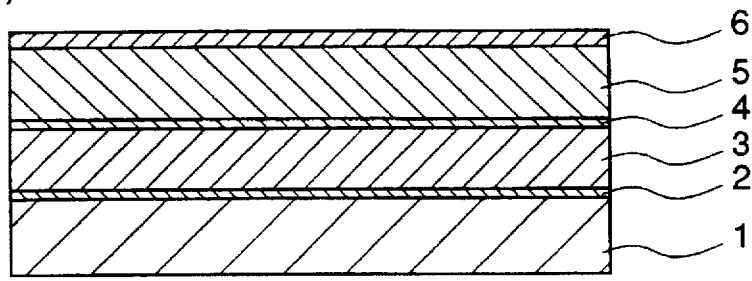
FIGS. 2(a)-2(d) are sectional views illustrating a method of fabricating a semiconductor laser device according to a first embodiment of the present invention.
Figure 2:
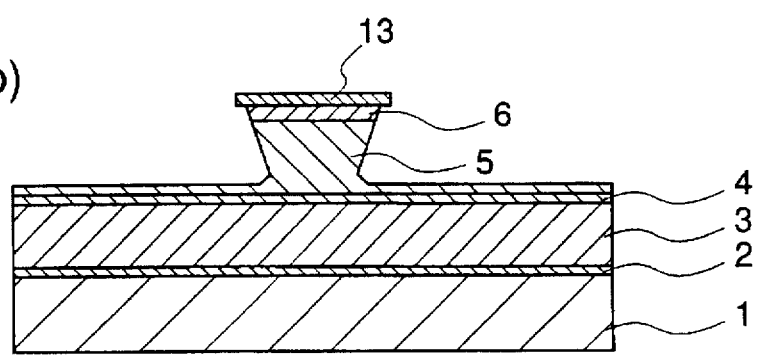
Figure 2:
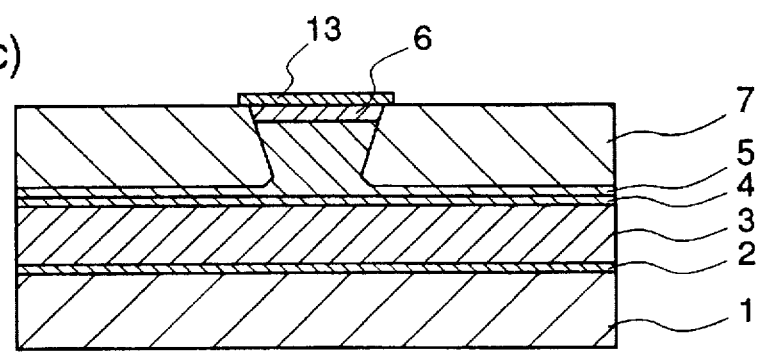
Figure 2:
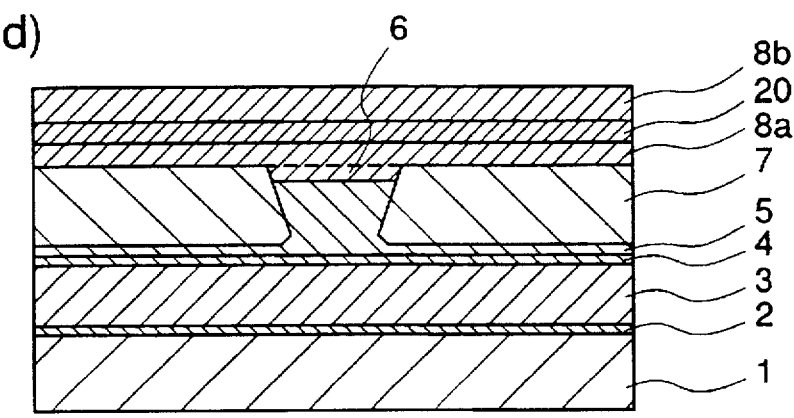

A description is given of the method of fabricating the semiconductor laser device according to the first embodiment of the invention with reference to FIGS. 2(a)–2(d). In the step of FIG. 2(a), the n type GaAs buffer layer 2, the n type Al$_s$Ga$_{1-s}$As (s=0.48) lower cladding layer 3, the quantum well active layer 4, the p type Al$_t$Ga$_{1-t}$As (t=0.48) upper cladding layer 5, and the p type GaAs first contact layer 6 are successively epitaxially grown on the n type GaAs substrate 1.

Subsequently, a stripe shaped insulating film mask 13 extending in what becomes the resonator length direction is formed on the p type GaAs first contact layer 6, and using the insulating film mask 13 as a mask, the p type GaAs first contact layer 6 and the p type Al$_t$Ga$_{1-t}$As (t=0.48) upper cladding layer 5 are removed by wet etching, whereby a stripe shaped ridge structure is formed as shown in FIG. 2(b). Here, in order to precisely control the remaining thickness of the p type upper cladding layer 5 other than the ridge structure in this etching, are etching stopper layer having a different etching rate may be provided at a position at which the etching of the upper cladding layer 5 is to be stopped.

Thereafter, in the step of FIG. 2(c), the n type Al$_{0.7}$Ga$_{0.3}$As current blocking layers 7 are formed on the upper cladding layer 5 at the opposite sides of the ridge structure so as to bury the ridge structure, and in the step of FIG. 2(d), after removal of the insulating film mask 13, the first p type GaAs second contact layer 8a, the multiple reflection film layer 20, and the second p type GaAs second contact layer 8b are successively grown on the p type GaAs first contact layer 6 and the current blocking layers 7. Finally, the p side electrode 9 is formed on the p type GaAs second contact layer 8 and an n side electrode 10 is formed on the rear surface of the n type GaAs substrate 1, and cleaving is performed in a direction perpendicular to the stripe direction of the ridge structure to form a pair of the laser resonator facets 17, thereby producing the semiconductor laser device shown in FIG. 1(a).

A description is given of the operation. When a voltage is applied to the laser so that the p side electrode 9 is a positive voltage and the n side electrode 10 is a negative voltage, holes are injected into the active layer 4 through the p type second contact layer 8 including the multiple reflection film layer 20, the p type first contact layer 6, and the p type upper cladding layer 5, and electrons are injected into the active layer 4 through the n type GaAs substrate 1, the n type buffer layer 2, and the n type lower cladding layer 3. The electrons and holes in the active layer 4 generate light by recombination, and thereby producing laser oscillation between the resonator facets 17. Then, the n type current blocking layers 7 are disposed at opposite sides of the ridge structure and a pnp structure is formed by the p type second contact layer 8, the n type current blocking layer 7, and the p type upper cladding layer 5, whereby no current flows.

Among the laser beams generated in the active layer 4 and advancing in the semiconductor laser device in the direction other than the laser resonator length direction, the laser beams advancing in the direction of the semiconductor substrate 1 are reflected by the n side electrode 10 and return to the active layer 4, as in the prior art semiconductor laser device. The laser beams advancing to the contact layers 8, however, are reflected by the multiple reflection film layer 20 sandwiched between the contact layers 8 and return to the active layer 4. While in the prior art the laser beams advancing to the second contact layer 8 are reflected by the p side electrode 9, in the first embodiment the laser beams are reflected by the multiple reflection film layer 20 sandwiched between the contact layers 8 which is closer to the active layer 4 than the p side electrode 9. As a result, since the laser beams advancing in the direction other than the resonator length direction are reflected between the multiple reflection film layer 20 and the n side electrode 10 to occur laser oscillation, the reflection interval is narrower than that of the prior art, so that the interval between the sub modes of the laser beam is narrower than that of the prior art, and even when the mode hop occurs, the interval between the wavelength of the main mode and the wavelength of a main mode generated after the mode hop is narrow and the of kink is small. Since the multiple reflection film layer has the same conductivity type as that of the second contact layer 8, the layer 8 does not exert an influence on the injection of the holes.

As described above, according to the present invention, since the multiple reflection film layer 20 is provided among the second contact layers 8 in the semiconductor laser device which has the quantum well active layer 4 comprising the InGaAs well layers 4b, the AlGaAs light guide layers 4a, and the AlGaAs barrier layer 4c and oscillates at 0.98 μm, most of the laser beams advancing to the substrate among the laser beams advancing in the direction other than the resonator length direction are reflected by the multiple reflection film layer 20 before reaching the p side electrode 9, and the interval between the main mode and the sub mode is narrowed, thereby preventing generation of kinks due to a large mode hop. Therefore, a stable and high output semiconductor laser device is obtained.

While in the first embodiment the multiple reflection film layer is sandwiched between the second contact layers 8, in the present invention the multiple reflection film layer 20 may be provided at any location between the p side electrode and the n side electrode and including a region on the emission region of the active layer, so as not to be contact with the active layer. For example, the multiple reflection film layer may be provided at any position between the p type first contact layer and the p type upper cladding layer, in the p type upper cladding layer, in the n type lower cladding layer, between the n type lower cladding layer and the n type buffer layer, in the n type buffer layer, between the n type buffer layer and the n type semiconductor substrate, or in the n type semiconductor substrate, with the same effects as in the above-described first embodiment.

While in the first embodiment the multiple reflection film layer 20 is provided only in the second contact layer 8 between the active layer 4 and the p side electrode 9, in the present invention a multiple reflection film layer may be further provided at a position of a between the active layer 4 and the n side electrode 10 to reflect the laser beams advancing in the direction other than the resonator length direction between two multiple reflection film layers 20. In this case, the interval in which the laser beams are reflected is further shortened, and generation of kinks due to a large mode hop is prevented, thereby providing a stable and high output semiconductor laser device.

Embodiment 2

Figure 3:
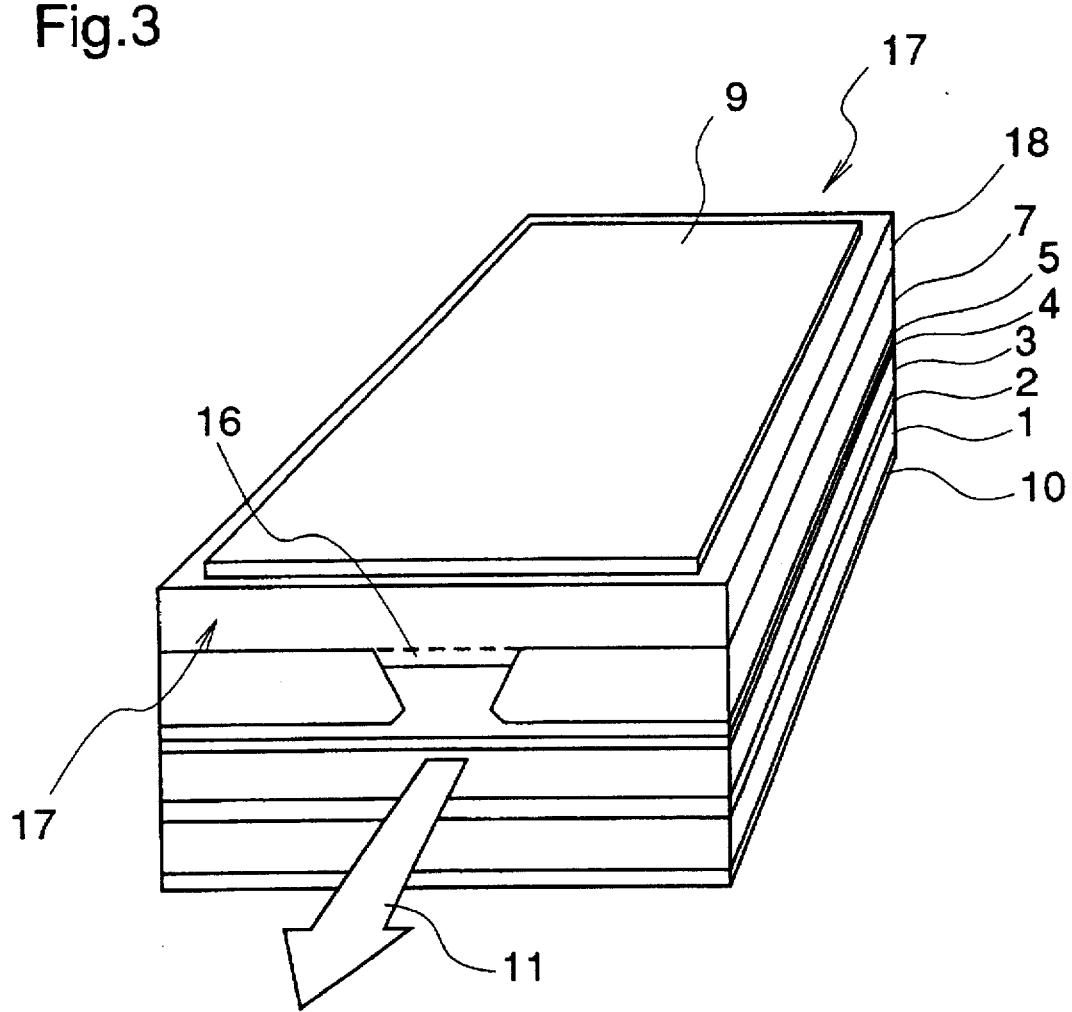
FIG. 3 is a perspective view illustrating a semiconductor laser device according to a second embodiment of the present invention.

FIG. 3 is a perspective view illustrating a semiconductor laser device according to a second embodiment of the present invention. In FIG. 3, the same reference numerals as in FIG. 1(a) designate the same or corresponding parts. Reference numeral 16 designates a p type first contact layer comprising germanium (Ge) and numeral 18 designates a p type Ge second contact layer. The semiconductor laser device of the second embodiment is fabricated by the same fabricating method as in the first embodiment, and after the process shown in FIG. 2(c) of the first embodiment, the semiconductor laser device is fabricated by removing the insulating film 13 and growing Ge.

A description is given of the function. Initially, the relation of semiconductor material, lattice constant, and band gap energy is represented by the following table.

| material | lattice constant (angstrom) | band gap energy (eV) |
|---|---|---|
| GaAs | 5.6533 | 1.42 |
| Ge | 5.6575 | 0.80 |
| Si | 5.4309 | 1.12 |
| $In_{0.2}Ga_{0.8}As$ | 5.7343 | 1.26 |
| InAs | 6.0584 | 0.36 |

As described in this table, the band gap energy of Ge used as the contact layer of the semiconductor laser device according to the second embodiment is 0.80 eV, smaller than the band gap energy of 1.26 eV corresponding to the laser beam having an oscillation wavelength of 0.98 μm. Therefore, when the laser beams advancing in the direction of the p side electrode 9 among the laser beams advancing in the direction other than the resonator length direction are incident on the first contact layer 16 and the second contact layer 18, the laser beams are absorbed therein. As a result, reflection between the p side electrode 9 and the n side electrode 10 of the laser beam is suppressed without reaching the p side electrode 9 and being reflecting by the p side electrode. Therefore, oscillation of the laser beams between the p side electrode 9 and the n side electrode 10 is suppressed, the wavelength interval between the main mode and the sub mode is narrow, and the generation of kinks due to a large mode hop is prevented.

When the laser device is fabricated by epitaxial crystal growth, the lattice constant of the semiconductor substrate has to coincide as closely as possible with the lattice constant of the semiconductor material laminated on the substrate as possible. In the second embodiment, the lattice constant of Ge which is used as the contact layer is 5.6575 Å and the lattice constant of GaAs which is used for the substrate of the semiconductor laser device that oscillates at 0.98 μm is 5.6533 Å, and the difference in the lattice constants between the contact layer and the substrate is represented by {(lattice constant of Ge−lattice constant of GaAs)/lattice constant of GaAs}×100 where the value is 0.07%. Therefore, good crystal growth of Ge contact layer is enabled, and a semiconductor laser device having the same quality as the prior art semiconductor laser device in which GaAs is employed as the contact layer is obtained.

According to the second embodiment, in the semiconductor laser device which includes the quantum well active layer 4 comprising the InGaAs well layers 4b, the AlGaAs light guide layers 4a, and the AlGaAs barrier layer 4c and has an oscillation wavelength of 0.98 μm, since the materials of the first contact layer 16 and the second contact layer 18 are Ge, a semiconductor laser device suppressing the oscillation of the laser beams between the p side electrode and the n side electrode, preventing the generation of kinks, and obtaining stable high power output is realized without deteriorating the quality.

While in the second embodiment the Ge layer comprising the material absorbing the laser beams is used as the p type first contact layer 16 and the p type second contact layer 18, in the present invention at least one layer among the p type first contact layer, the p type second contact layer, the n type semiconductor substrate, and the n type buffer layer, or a part of these layers may be a Ge layer, with the same effects as in the second embodiment.

Embodiment 3

Figure 4:
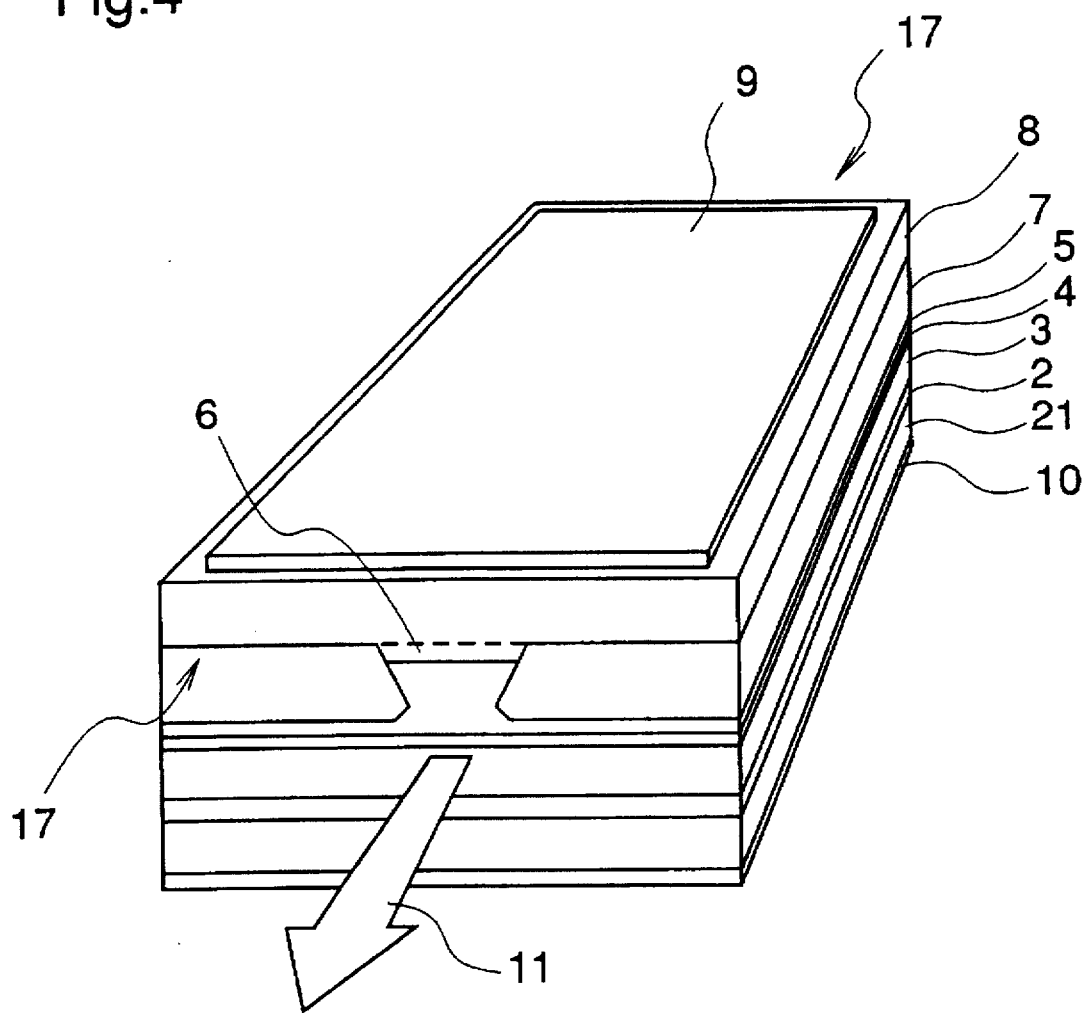
FIG. 4 is a perspective view illustrating a semiconductor laser device according to a third embodiment of the present invention.

FIG. 4 is a perspective view illustrating a semiconductor laser device according to a third embodiment of the present invention. In FIG. 4, the same reference numerals as in FIG. 1(a) designate the same or corresponding part, where reference numeral 21 designates an n type Si substrate.

FIGS. 5(a)-5(e) are sectional views illustrating process steps in a method of fabricating the semiconductor laser device according to the third embodiment of the present invention. In the figures, the same reference numerals as in FIG. 4 designate the same or corresponding parts. Reference numeral 15 designates an insulating film mask, numerals 5a and 5b designate first and second p type $Al_xGa_{1-x}As$ (t=0.48) upper cladding layers, respectively, and numeral 8d designates a p type GaAs substrate serving as a second contact layer.

A description is given of the method of fabricating the semiconductor laser device according to the third embodiment of the present invention. Atoms constituting the compound semiconductor crystal substrate are arranged at a definite interval, i.e., at a definite lattice constant. When the semiconductor layers are epitaxially grown on the substrate, it is difficult to perform a good crystal growth in a case where the semiconductor layer which is grown is a compound semiconductor crystal having a the different lattice constant from that of the substrate. According to the above table, the lattice constant of Si is 5.4309 Å and the lattice constant of GaAs employed for the substrate of the semiconductor laser device which oscillates at 0.98 µis 5.6533 Å, and the difference of the lattice constants between these semiconductor crystals is represented by {(lattice constant of Si–lattice constant of GaAs)/lattice constant of GaAs}×100 where the value is 3.9%. Therefore, it is difficult to perform a good crystal growth.

Disclosed is a hetero structure bonding technique, in which the semiconductor materials each having a different lattice constant are adhered, and bonded by heating, in App. Phys. Lett. 58 (18), 6 May 1991 p. 1961. In this technique, the semiconductor layers each having a different lattice constant are laminated, and the semiconductor layers are heated to 650° C. and held at that temperature with a hydrogen flow to remove the native oxides of the laminated surface and to bond the semiconductor layers. Therefore, by using this technique, the semiconductor laser device having a difference in the lattice constants between the substrate and the semiconductor materials of 3.8% can obtain the same quality and the same characteristics as the semiconductor laser device comprising semiconductor materials having the same lattice constant as that of the substrate.

In the method of fabricating of the semiconductor laser device according to the third embodiment, employing this technique, after the semiconductor laser device structure is grown on the p type GaAs substrate 8 as the growth substrate, the Si substrate is bonded to the structure, and a semiconductor laser device of which the GaAs substrate 8 is used as the contact layer is obtained.

Figure 5:
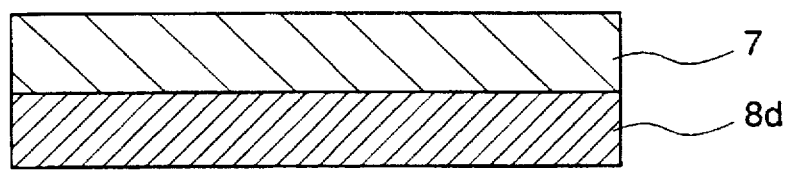
FIGS. 5(a)-5(e) are sectional views illustrating a method of fabricating a semiconductor laser device according to a third embodiment of the present invention.
Figure 5:
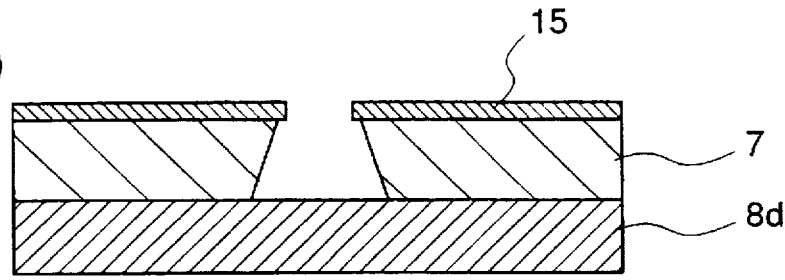
Figure 5:
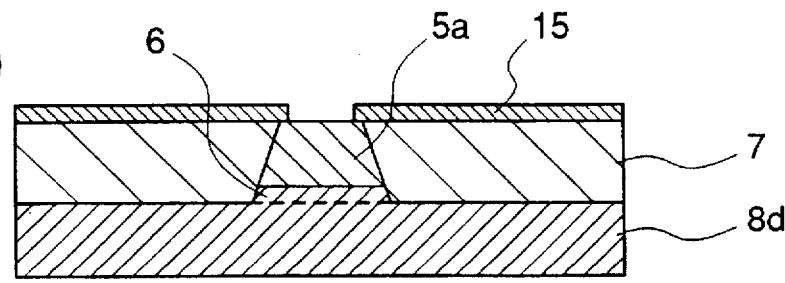
Figure 5:
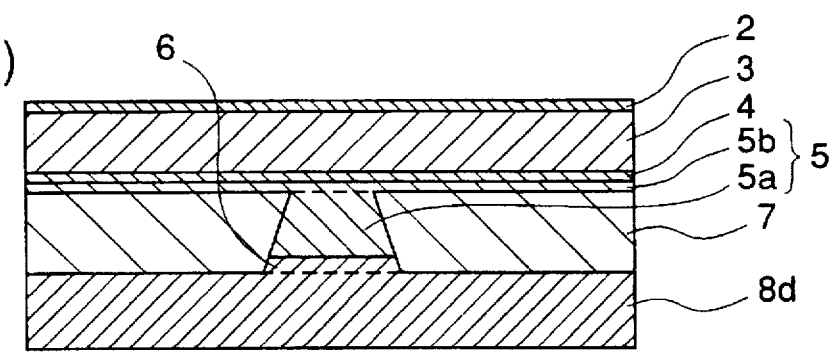
Figure 5:
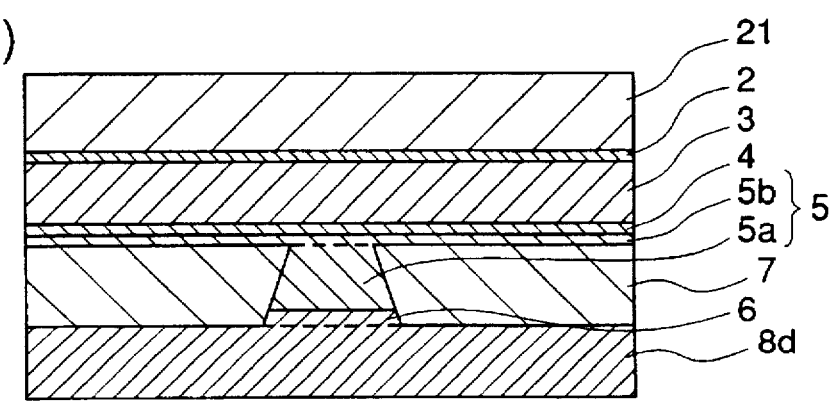

Initially, in the step of FIG. 5(a), the p type GaAs substrate 8d serving as the second contact layer is prepared and the n type current blocking layer 7 is grown on the substrate 8d. In the step of FIG. 5(b), an insulating film mask 15 such as SiN extending in what becomes that laser resonator length direction and having a stripe-shaped opening are formed on the n type current blocking layer 7 by a combination of deposition and photolithography. Employing the insulating film mask 15 as a mask, the n type current blocking layer 7 is removed by wet etching to reach the n type GaAs substrate 8d, and a stripe-shaped groove formed by etching and extending in what becomes a resonator length direction (hereinafter, referred to as groove) is formed.

Subsequently, employing the insulating film mask 15 as a mask, the p type first contact layer 6 is grown so as to fill the bottom of the groove, and further the first p type upper cladding layer 5a is formed so as to completely fill the groove. After the removal of the insulating film mask 15, the second p type upper cladding layer 5b, the multi-quantum-well active layer 4, the n type lower cladding layer 3, and the n type buffer layer 2 are successively grown on the n type current blocking layers 7 and the first p type upper cladding layer 5a.

Next, the n type Si substrate 21 is prepared and disposed on the n type GaAs buffer layer 2, employing the above-described hetero structure bonding technique, the n type Si substrate 21 and the n type buffer layer 2 are heated to 650° C. and held at that temperature for 30 min with a hydrogen flow to bond the n type Si substrate 21 and the n type GaAs buffer layer 2. Thereafter, the rear surface of the crystal growth surface of the p type GaAs substrate 8d used as the growth substrate is polished as needed and the thickness of the p type GaAs substrate 8d is adjusted to a prescribed thickness to form the p type second contact layer 8 from the p type GaAs substrate 8d. Then, the p side electrode 9 is disposed on the rear surface of the p type second contact layer 8 and the n side electrode 10 is disposed on the surface of the Si substrate other than the contact surface, respectively, and cleavage is performed perpendicular to the stripe direction of the groove and a pair of the resonator facets 17 is formed, thereby producing the semiconductor laser device shown in FIG. 4.

According to the semiconductor laser device of the third embodiment, since the band gap energy of Si used as the n type semiconductor substrate 21 is 1.12 eV smaller than the energy 1.26 eV of the laser beam having the oscillation wavelength of 0.98 µm, among the laser beams advancing in the direction other than the resonator length direction in the semiconductor laser device, the laser beams advancing in the direction of the Si substrate 21 are absorbed in the substrate 21, with the same effects as in the second embodiment.

In addition, the lattice constant of the n type Si substrate 21 is 5.4309 Å and the difference in the lattice constants between the n type Si substrate 21 and the p type GaAs substrate 8 is large. Since the n type Si substrate 21 is bonded to the n type buffer layer 2 by the hetero structure bonding technique, the crystallinity is improved and the laser characteristics are not degraded due to degradation of the crystallinity.

Further, even if the difference in the lattice constants of the n type Si substrate 21 and the p type second contact layer 8 is large, a current is injected, whereby a semiconductor laser device having satisfactory laser characteristics can be fabricated.

As described above, in the semiconductor laser device having the oscillation wavelength of 0.98 μm and including the quantum well active layer 4 which comprises the InGaAs well layers 4b, the AlGaAs light guide layers 4a, and the AlGaAs barrier layer 4c, since the material of the n type semiconductor substrate 21 is Si and the n type Si substrate 21 is bonded on the n type GaAs buffer layer 2 by the hetero structure bonding technique, a semiconductor laser device suppressing oscillation of the laser beams between the p side electrode and the n side electrode, preventing the generation of kinks, and producing a stable high power output is realized without degrading quality.

While in the third embodiment the n type Si substrate is employed as the n type semiconductor substrate formed by the hetero structure bonding technique, in the present invention any layers absorbing the laser beams may be employed as the n type semiconductor substrate, with the same effects as in the above-described embodiment. For example, since the band gap energy (eV) of the $In_vGa_{1-v}As$ (v=0.2) layer is the same as the band gap energy corresponding to the laser beam having the oscillation wavelength of 0.98 μm, n type $In_vGa_{1-v}As$ (v>0.2) having a larger In composition ratio is employed instead of the Si substrate, which layer is bonded by the hetero structure bonding technique, thereby producing the same effects as in the second embodiment.

In addition, while in the third embodiment Si absorbing the laser beams is employed as the semiconductor substrate, in the present invention at least one layer among the p type first contact layer, the p type second contact layer, the n type semiconductor substrate, and the n type buffer layer, or a part of these layers may be Si formed by the hetero structure bonding technique, with the same effect as in the third embodiment.

Embodiment 4

Figure 6:
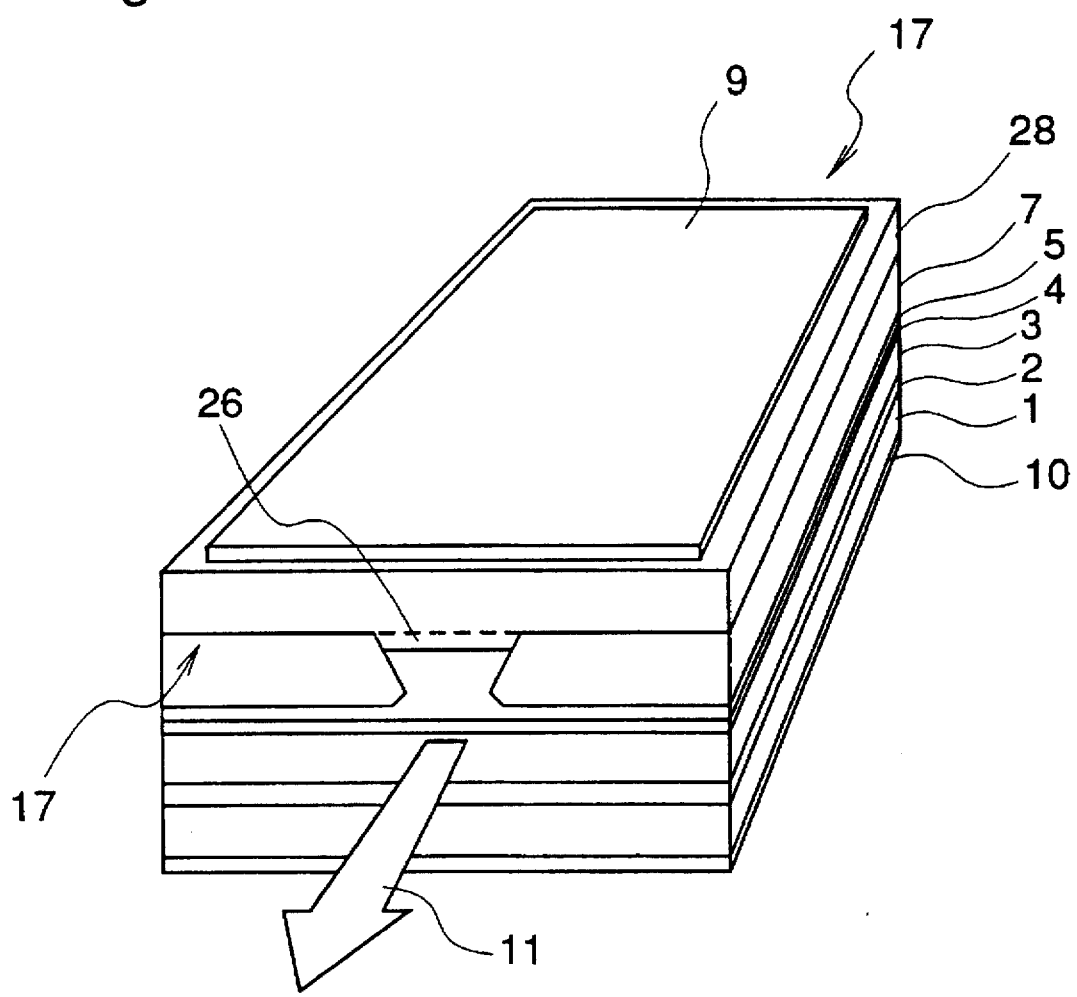
FIG. 6 is a perspective view illustrating a semiconductor laser device according to a fourth embodiment of the present invention.

FIG. 6 is a perspective view illustrating a semiconductor laser device according to a fourth embodiment of the present invention. In FIG. 6, the same reference numerals as in FIG. 3 designate the same or corresponding parts. Reference numeral 26 designates a p type $In_vGa_{1-v}As$ (v=0.3) first contact layer and numeral 28 designates a p type $In_vGa_{1-v}As$ (v=0.3) second contact layer.

Since, in the $In_vGa_{1-v}As$ employed as the material for the first contact layer 26 and the second contact layer 28 of the semiconductor laser device, the band gap energy (eV) in a case where In composition ratio x is 0.2 is the same as the band gap energy corresponding to the laser beam having the oscillation wavelength of 0.98 μm, by making the In composition ratio x larger, among the laser beams advancing in the direction other than the resonator length direction in the semiconductor laser device, the laser beams advancing in the direction of the p side electrode 9 are absorbed in the first contact layer 26 and the second contact layer 28. As shown in the table of the second embodiment, however, since the lattice constant of $In_vGa_{1-v}As$ (v=0.2) is 5.7343 Å, and the difference in the lattice constant from GaAs used as the growth substrate of the semiconductor laser device which oscillates at 0.98 μm is larger than 1.4%, it is difficult to perform good crystal growth. Further, the lattice constant is increased with an increase in In composition ratio v, and the difference in the lattice constants is also increased, for example, when In composition ratio v is 1, i.e., the differ-ence in the lattice constants between GaAs and InAs is 7.2%, so that the crystal growth is difficult.

In order to solve the problem, in the semiconductor laser device of the second embodiment shown in FIG. 3, instead of growing Ge as the first contact layer 16 and the second contact layer 18, the $In_vGa_{1-v}As$ (v=0.3) is the first contact layer 26 and the second contact layer 28. Therefore, the $In_vGa_{1-v}As$ (v=0.3) layer is formed without the problem of the crystal growth, with the same effects as in the third embodiment.

Although in the fourth embodiment the first contact layer 26 and the second contact layer 28 are not formed by crystal growth, they are formed by deposition and where enough current flows for laser oscillation, the first contact layer 26 and the second contact layer 28 are efficient.

According to the fourth embodiment, in the semiconductor laser device having the oscillation wavelength of 0.98 μm and including the quantum well active layer 4 which comprises the InGaAs well layers 4b, the AlGaAs light guide layers 4a, and the AlGaAs barrier layer 4c, since the material of the p type first contact layer 26 and the p type second contact layer 28 is $In_vGa_{1-v}As$ (v=0.3) and these layers are formed by deposition, a semiconductor laser device suppressing the oscillation of the laser beams between the p side electrode and the n side electrode, preventing the generation of kinks, and producing a stable high power output can be provided.

While in the fourth embodiment the In composition ratio of $In_vGa_{1-v}As$ as the material of the p type first and second contact layers is 0.3, in the present invention In composition ration may be any value which enables to absorption of the laser beams. For example, when the oscillation wavelength of the laser beam is 0.98 μm, In composition ratio may be larger than 0.2, with the same effects as in the fourth embodiment.

In addition, while in the fourth embodiment $In_vGa_{1-v}As$ (v=0.3) layer is used as the first and second contact layers, in the present invention layers in which the material absorbing the laser beams, such as an n type Si, formed by deposition may by employed, with the same effects as in the fourth embodiment.

Further, while in the fourth embodiment $In_vGa_{1-v}As$ (v=0.2) is the material absorbing the laser beams and used as the first and second contact layers, in the present invention at least one layer among the p type first contact layer, the p type second contact layer, the n type semiconductor substrate, and the n type buffer layer, or a part of these may be $In_vGa_{1-v}As$ (v>0.2) layer, with the same effects as in the fourth embodiment.

Embodiment 5

Figure 7:
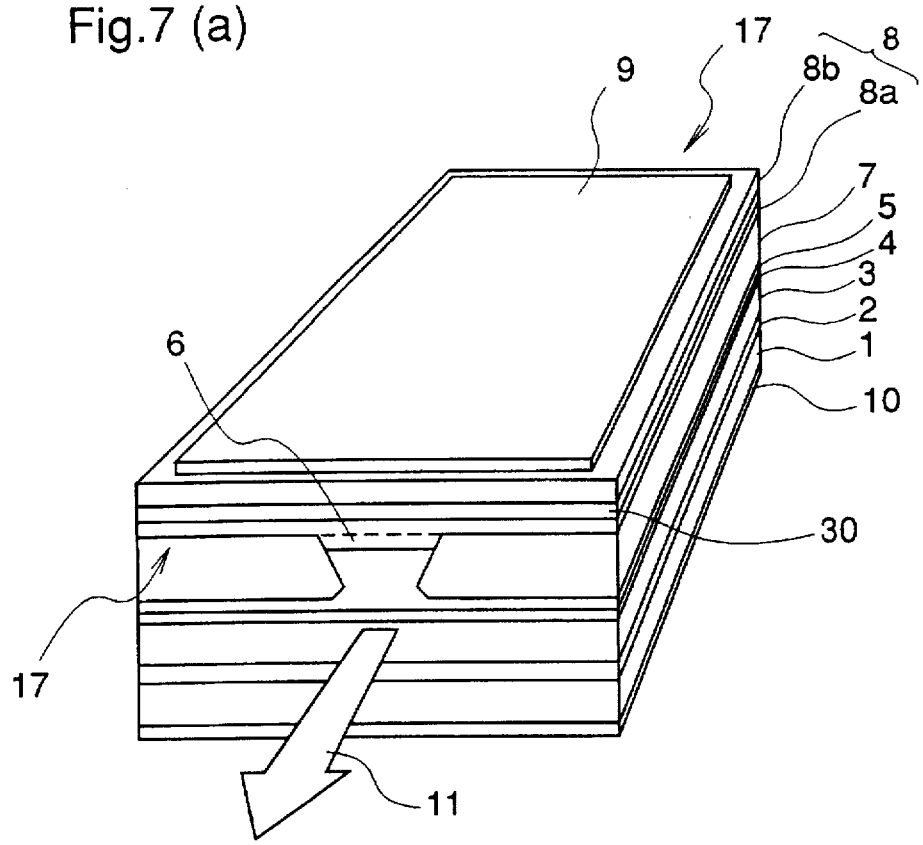
FIG. 7(a) is a perspective view illustrating a semiconductor laser device according to a fifth embodiment of the present invention and FIG. 7(b) is a band diagram showing a main part of the semiconductor laser device.
Figure 7:
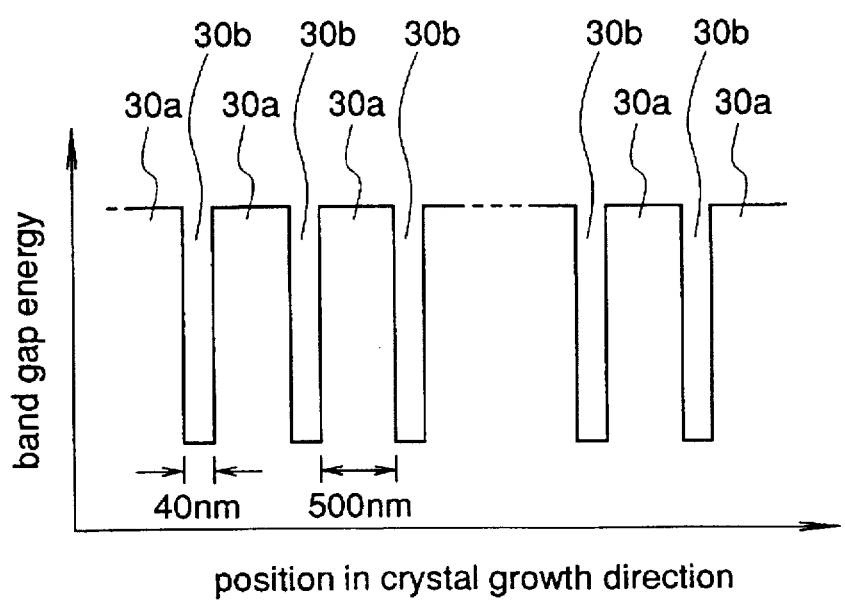

FIG. 7(a) is a perspective view illustrating a semiconductor laser device according to a fifth embodiment of the present invention and FIG. 7(b) is a band diagram showing a main part thereof. In the figures, the same reference numerals as in FIG. 1(a) designate the same or corresponding parts. Reference numeral 30 designates a layer alternatingly laminating about ten p type $Al_wGa_{1-w}As$ (w=0.48) layers 400 Å thick and about ten $In_zGa_{1-z}As$ (z=0.3) layers 500 Å thick (hereinafter, referred to as critical film thickness layer laminated structure). In the semiconductor laser device of the fifth embodiment, instead of growing the multiple reflection layer 20 using the fabricating method of the first embodiment, the critical film thickness layer laminated structure 30 is grown.

Figure 8:
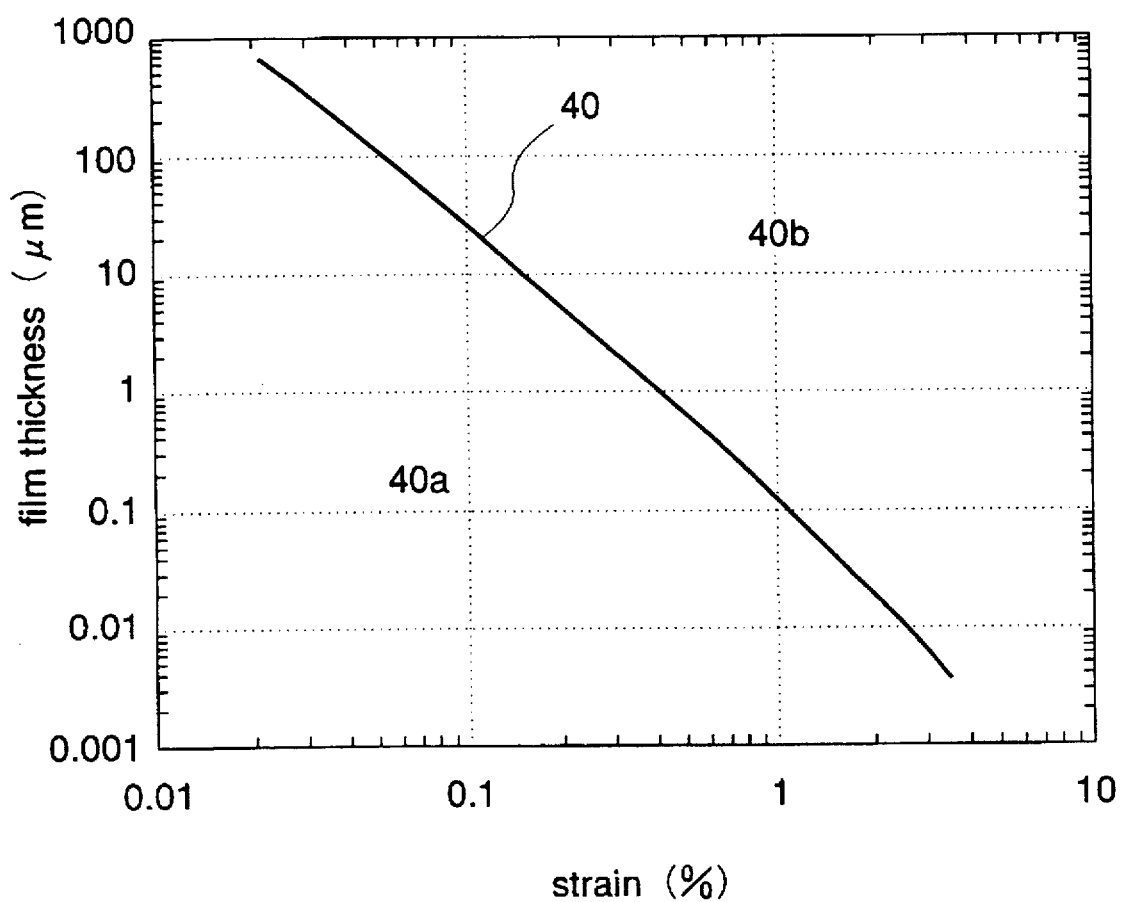
FIG. 8 is a graph showing a relation between thickness of a crystal growth film and strain, for explaining a semiconductor laser device according to a fifth embodiment of the present invention.

A description is given of the critical film thickness layer laminated structure 30. As described in the third embodiment, it has been difficult to grow a semiconductor material having a different lattice constant from that of the substrate. On the contrary, as described in App. Phys. Lett. 47, 1985 p. 322, it is theoretically and experimentally proved that, even if the semiconductor material has a different lattice constant from that of the substrate, a good crystal growth is performed with a prescribed film thickness, i.e., a thickness smaller than the critical film thickness. A theoretical curve by R. People and J. C. Bean is shown in FIG. 8. FIG. 8 is a graph showing a relation between thickness and strain in a case where a semiconductor layer having a different lattice constant from that of the semiconductor substrate is grown on the substrate comprising the prescribed material. In FIG. 8, the ordinate indicates thickness (μm) of the grown semiconductor layer and the abscissa indicates a strain (%) of the grown semiconductor layer and the semiconductor substrate. Reference numeral 40 designates a boundary between a lower region 40a of the boundary where a good crystal growth is possible and an upper region 40b of the boundary where a good crystal growth is difficult. Strain between the grown semiconductor layer and the semiconductor substrate is represented by $$\{(a1-a2)/a2\} \times 100$$

where a1 is a lattice constant of the semiconductor substrate and a2 is a lattice constant of the semiconductor layer. As shown in FIG. 8, the critical film thickness, i.e., the thickness at which is possible to perform a good crystal growth, gradually decreases with an increase in strain.

Figure 9:
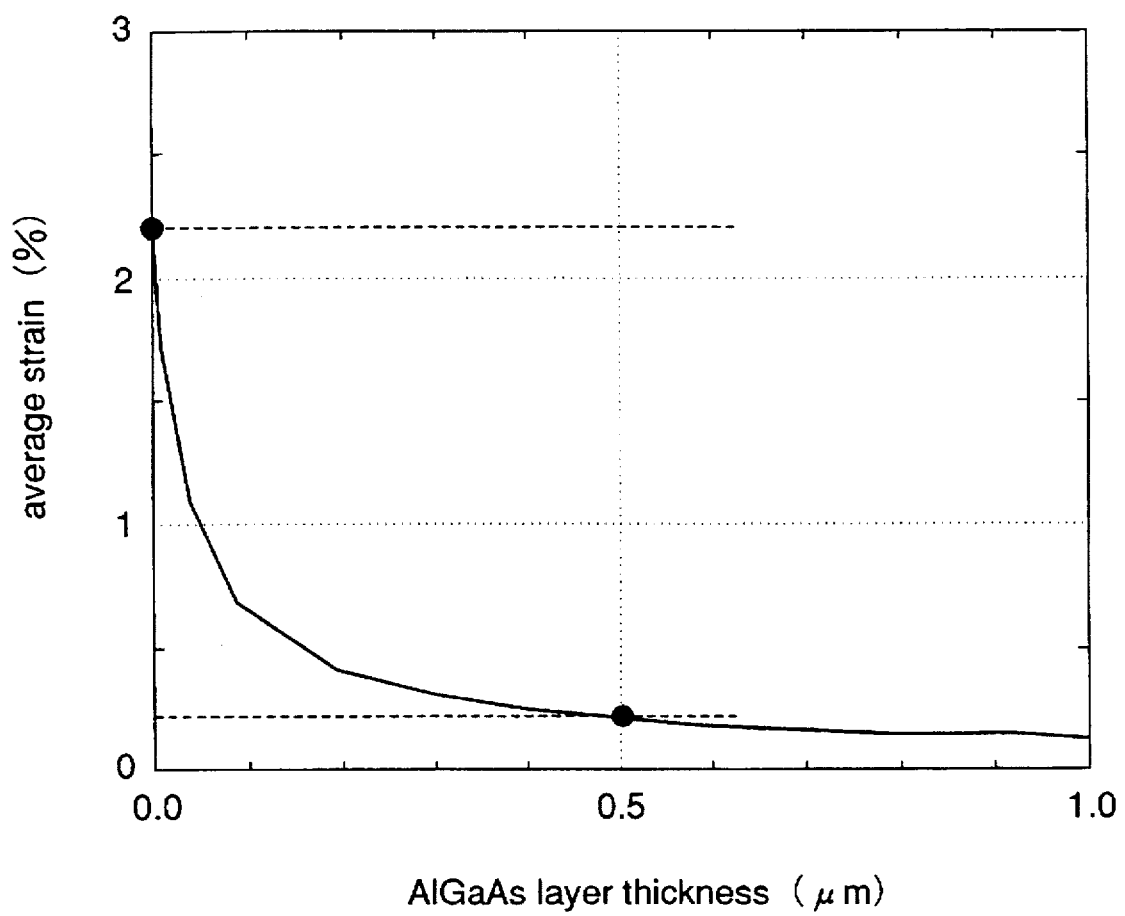
FIG. 9 is a graph showing a relation between thickness of an AlGaAs layer formed on an InGaAs layer and average strain, for explaining a semiconductor laser device according to a fifth embodiment of the present invention.

FIG. 9 is a graph showing a relation between average strain E (%) when the thickness of an $In_zGa_{1-z}As$ (z=0.3) thin film layer is stable at 400 Å and the thickness (μm) of an $Al_wGa_{1-w}As$ (w=0.48) layer, in a case where the $In_zGa_{1-z}As$ (z=0.3) layer and the $Al_wGa_{1-w}As$ (w=0.48) layer are successively grown on an GaAs layer. In FIG. 9, the abscissa indicates film thickness (μm) of the $Al_wGa_{1-w}As$ (w=0.48) layer and the ordinate indicates an average strain (%) between the $In_zGa_{1-z}As$ (z=0.3) layer and the $Al_wGa_{1-w}As$ (w=0.48) layer. This average strain E is represented by $$E=(d{InGaAs} \times E{InGaAs} + d{AlGaAs} \times E{AlGaAs})/(d{InGaAs} + d{AlGaAs})$$

where dInGaAs: thickness of $In_zGa_{1-z}As$ (z=0.3) layer =400 Å, dAlGaAs: thickness of $Al_wGa_{1-w}As$ (w=0.48) layer=5000 Å, EInGaAs: strain of $In_zGa_{1-z}As$ (z=0.3) layer=2.1%, and EAlGaAs: strain of $Al_wGa_{1-w}As$ (w=0.48) layer=0.06%.

In FIG. 9, according to the fifth embodiment, by growing a layer having a small strain, i.e. the $Al_wGa_{1-w}As$ (w=0.48) layer on a layer having a large strain, i.e., the $In_zGa_{1-z}As$ (z=0.3) layer, average strain is reduced, and average strain E is decreased with an increase in the thickness of the layer having a small strain. For example, in a case where the $Al_wGa_{1-w}As$ (w=0.48) layer 5000 Å thick is grown as the $In_zGa_{1-z}As$ (z=0.3) layer 400 Å thick, average strain is decreased to about ⅒.

As described above, since by growing a layer having a large thickness and a small strain on a layer having a large strain, total strain is decreased and the critical film thickness is increased, and layers having a large difference in the lattice constants is also satisfactorily grown. In the fifth embodiment, utilizing a relation of the critical film thickness, the critical film thickness layer laminated structure, in which layers having a large strain and layers having a large thickness and a small strain are alternatingly laminated in a prescribed layer number, is provided in the p type second contact layer 8.

Although in the fifth embodiment the critical film thickness layer laminated structure 30, alternatingly laminating about ten p type $Al_wGa_{1-w}As$ (w=0.48) layers 30a 400 Å thick and about ten p type $In_zGa_{1-z}As$ (z=0.3) layers 30b 5000 Å thick, is provided between the first second contact layer 8a and the second second contact layer 8b, as shown in FIG. 7(b), the $In_zGa_{1-z}As$ (z=0.3) layer 30b in the critical film thickness layer laminated structure 30 has a smaller energy band gap than the energy band gap of the laser beam of 0.98 μm, so that the laser beams advancing in a direction other than the resonator length direction are absorbed in the $In_zGa_{1-z}As$ (z=0.3) layer 30b upon reaching the critical film thickness layer laminated structure 30. While since the thickness at the $In_zGa_{1-z}As$ (z=0.3) layer 30b is very thin at 400 Å, it is difficult to sufficiently absorb the laser beams in only one layer, in the fifth embodiment since about ten $In_zGa_{1-z}As$ (z=0.3) layers 30b are provided in the critical film thickness layer laminated structure 30, it is possible to sufficiently absorb the laser beams. As a result, the Ge layer absorbing the laser beams is provided as the first and second contact layers, with the same effects as in the second embodiment. Further, since the $In_zGa_{1-z}As$ (z=0.3) layer 30b is provided as one of the layers constituting the critical film thickness layer laminated structure 30, strain of the $In_zGa_{1-z}As$ (z=0.3) layer 30b is very small, whereby the laser characteristics are not affected by the $In_zGa_{1-z}As$ (z=0.3) layer 30b.

In the fifth embodiment, in the semiconductor laser device having an oscillation wavelength of 0.98 μm and including the quantum well active layer 4 which comprises the InGaAs well layers 4b, the AlGaAs light Guide layers 4a, and the AlGaAs barrier layer 4c, since the critical film thickness layer laminated structure 30 including the $In_zGa_{1-z}As$ (z=0.3) layer 30b is provided in the second contact layer 8, most of the laser beams advancing in the direction of the p side electrode 9, among the laser beams advancing in a the direction other than the resonator length direction in the semiconductor laser device which oscillates at 0.98, μm are absorbed by the $In_zGa_{1-z}As$ (z=0.3) layer whereby a semiconductor laser device suppressing the oscillation of the laser beams between the p side electrode and the n side electrode, preventing the generation of kinks, and producing a stable high power output can be provided without degradation of quality.

While in the fifth embodiment the critical film thickness layer laminated structure 30 including the $In_zGa_{1-z}As$ (z=0.3) layer is provided in the second contact layer 8, in the present invention the critical film thickness layer laminated structure 30 may be provided at any position between the p side electrode and the n side electrode and including a region above an emission region of the active layer so as not to be contact with the active layer. For example, the multiple reflection layer may be provided at any position between the p type first contact layer and the p type upper cladding layer, in the p type upper cladding layer, in the n type lower cladding layer, between the n type lower cladding layer and the n type buffer layer, in the n type buffer layer, between the n type buffer layer and the n type semiconductor substrate, or in the n type semiconductor substrate, with the same effects as in the first embodiment.

In addition, while in the fifth embodiment the layer including the $In_zGa_{1-z}As$ (z=0.3) layer 30b is used as the critical film thickness layer laminated structure 30, in the present invention the critical film thickness layer laminated structure 30 including the layer which comprises the material absorbing the laser beams may be used instead of the $In_zGa_{1-z}As$ (z=0.3) layer 30b, with the same effects as in the fifth embodiment.

Embodiment 6

Figure 10:
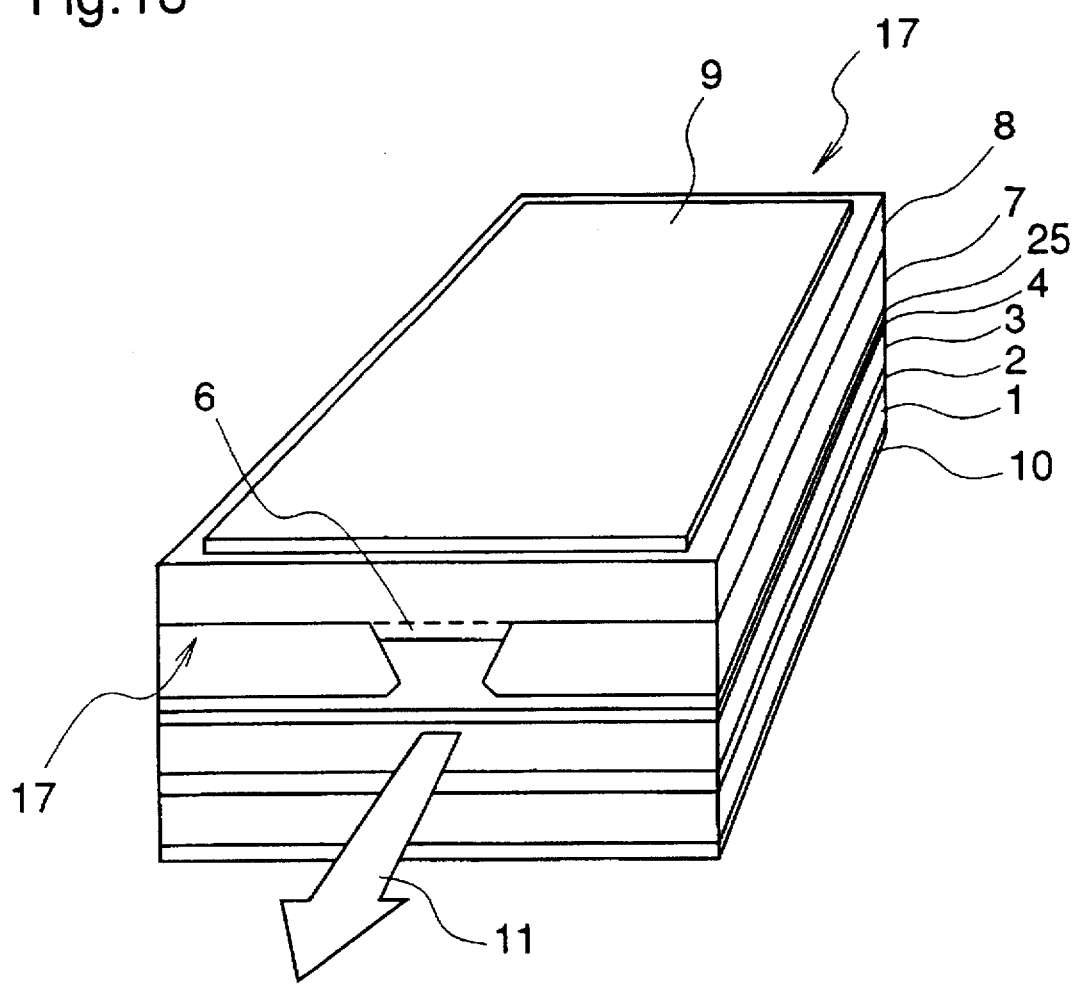
FIG. 10 is a perspective view illustrating a semiconductor laser device according to a sixth embodiment of the present invention.

FIG. 10 is a perspective view illustrating a semiconductor laser device according to a sixth embodiment of the present invention. In FIG. 10, the same reference numerals as in FIG. 1(a) designate the same or corresponding parts. Reference numeral 25 designates an $In_{0.51}Ga_{0.49}P$ upper cladding layer in which the thickness including the ridge structure is larger than 4 μm and numeral 8 designates a p type GaAs contact layer.

Figure 11:
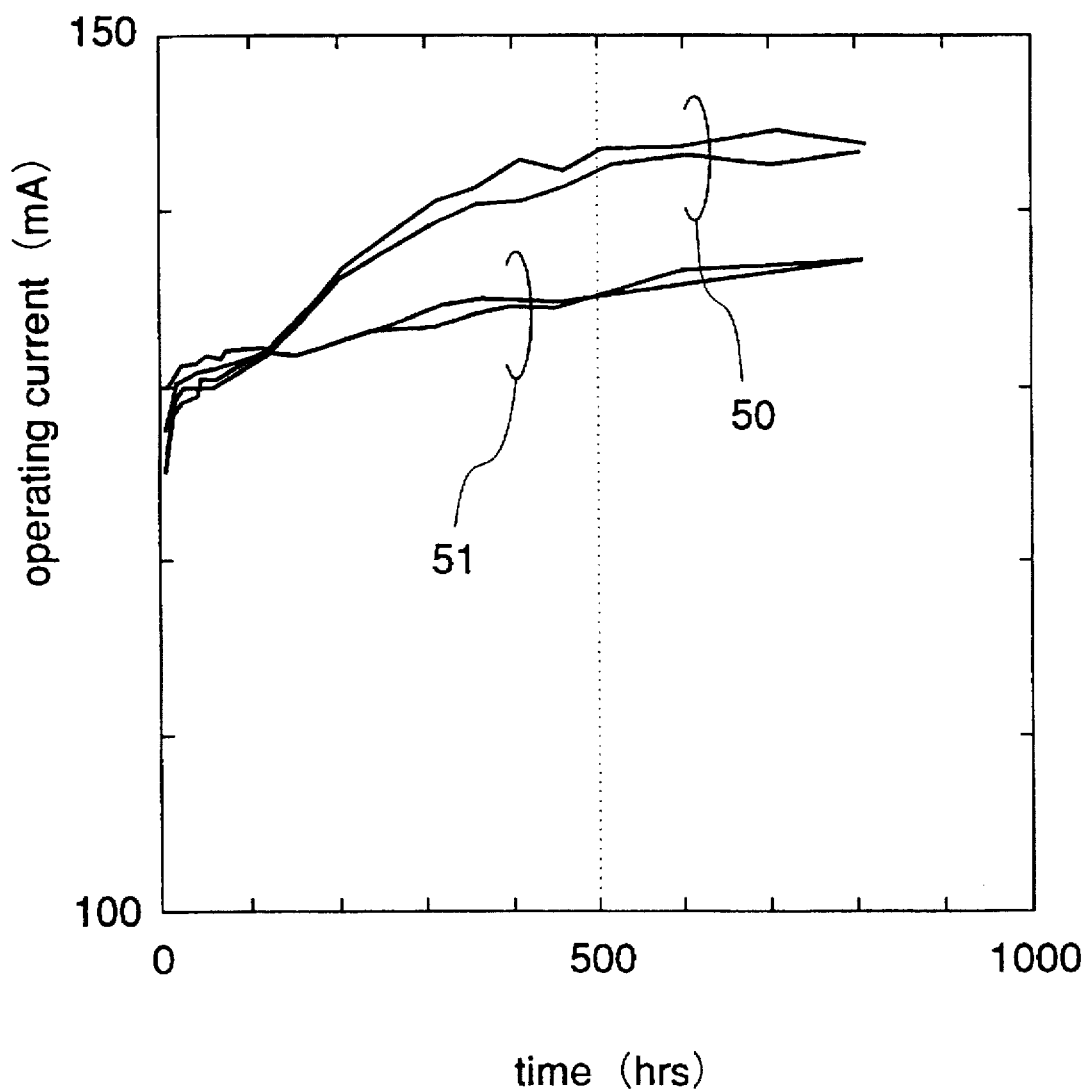
FIG. 11 is a graph showing a relation between thickness of the p type upper cladding layer of the prior art semiconductor laser device and lifetime, for explaining a semiconductor laser device according to a sixth embodiment of the present invention.
Figure 12:
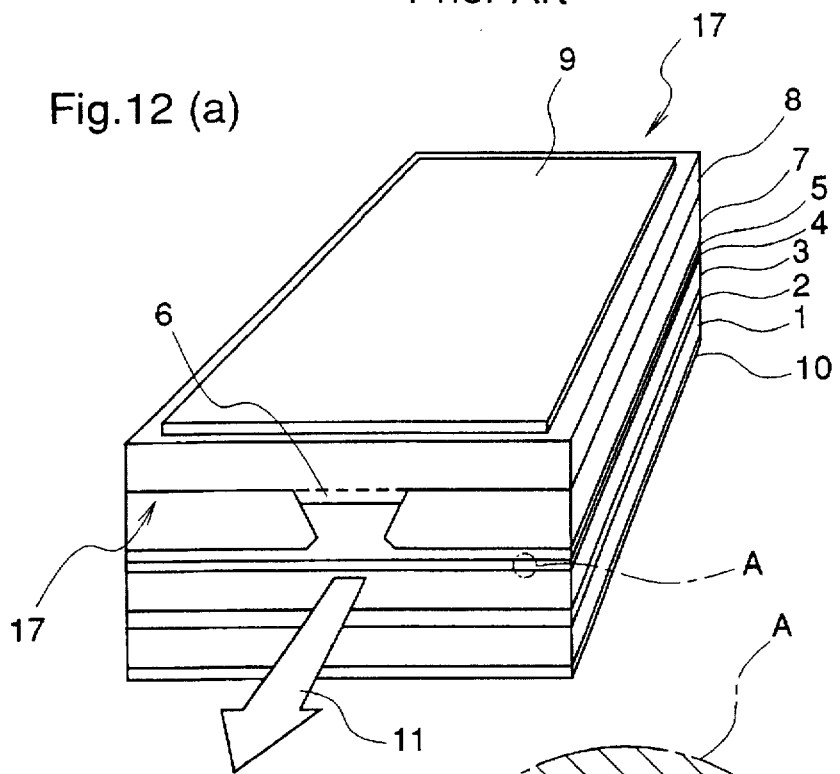
FIG. 12(a) is a perspective view illustrating a semiconductor laser device according to the prior art.
FIG. 12(b) is a enlarged view in the vicinity of the active layer of the semiconductor laser device.
FIG. 12(c) is a band diagram in the vicinity of the active layer of the semiconductor laser device.
Figure 12:
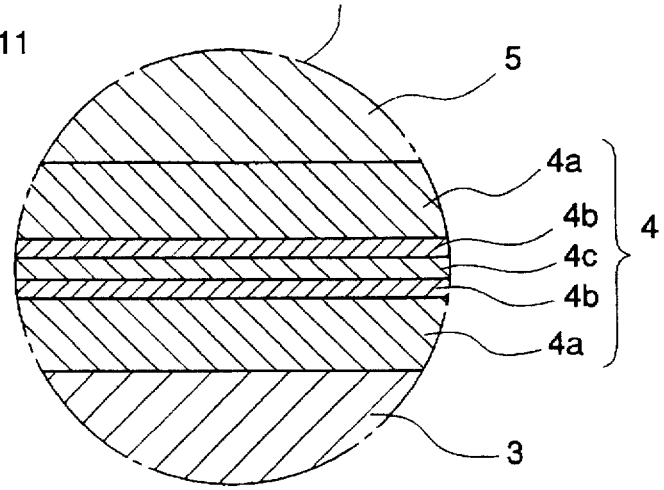
Figure 12:
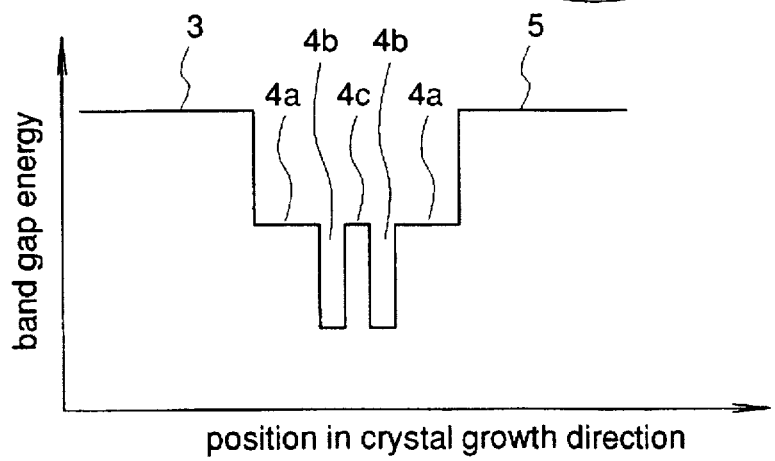
Figure 13:
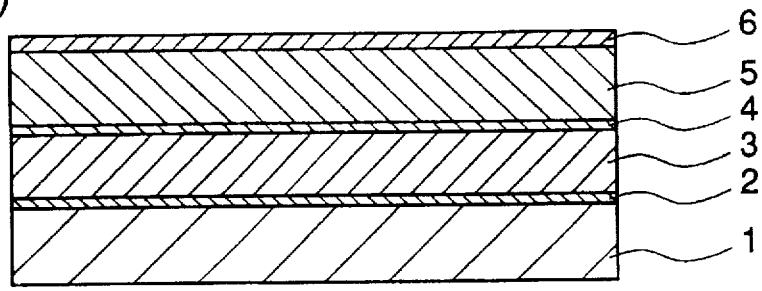
FIGS. 13(a)-13(d) are sectional views illustrating a method of fabricating the prior art semiconductor laser device.
Figure 13:
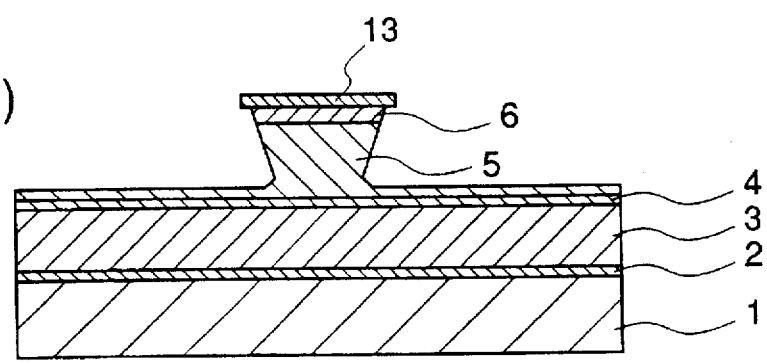
Figure 13:
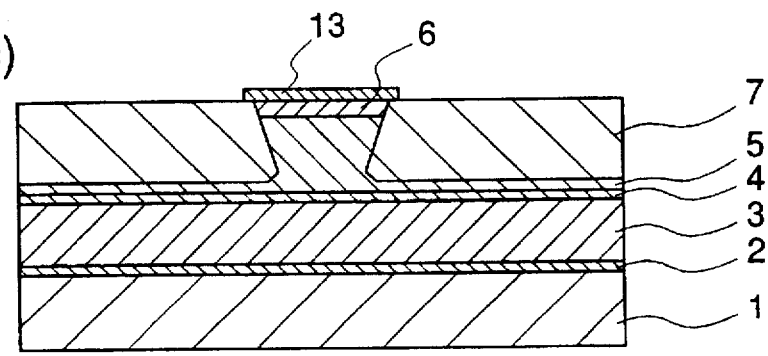
Figure 13:
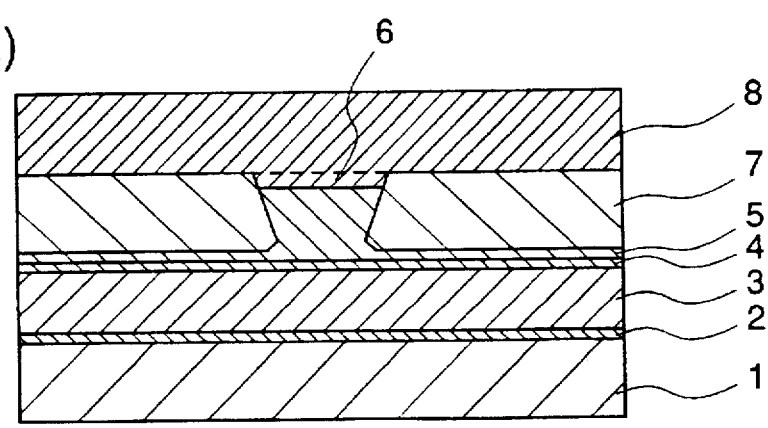
Figure 14:
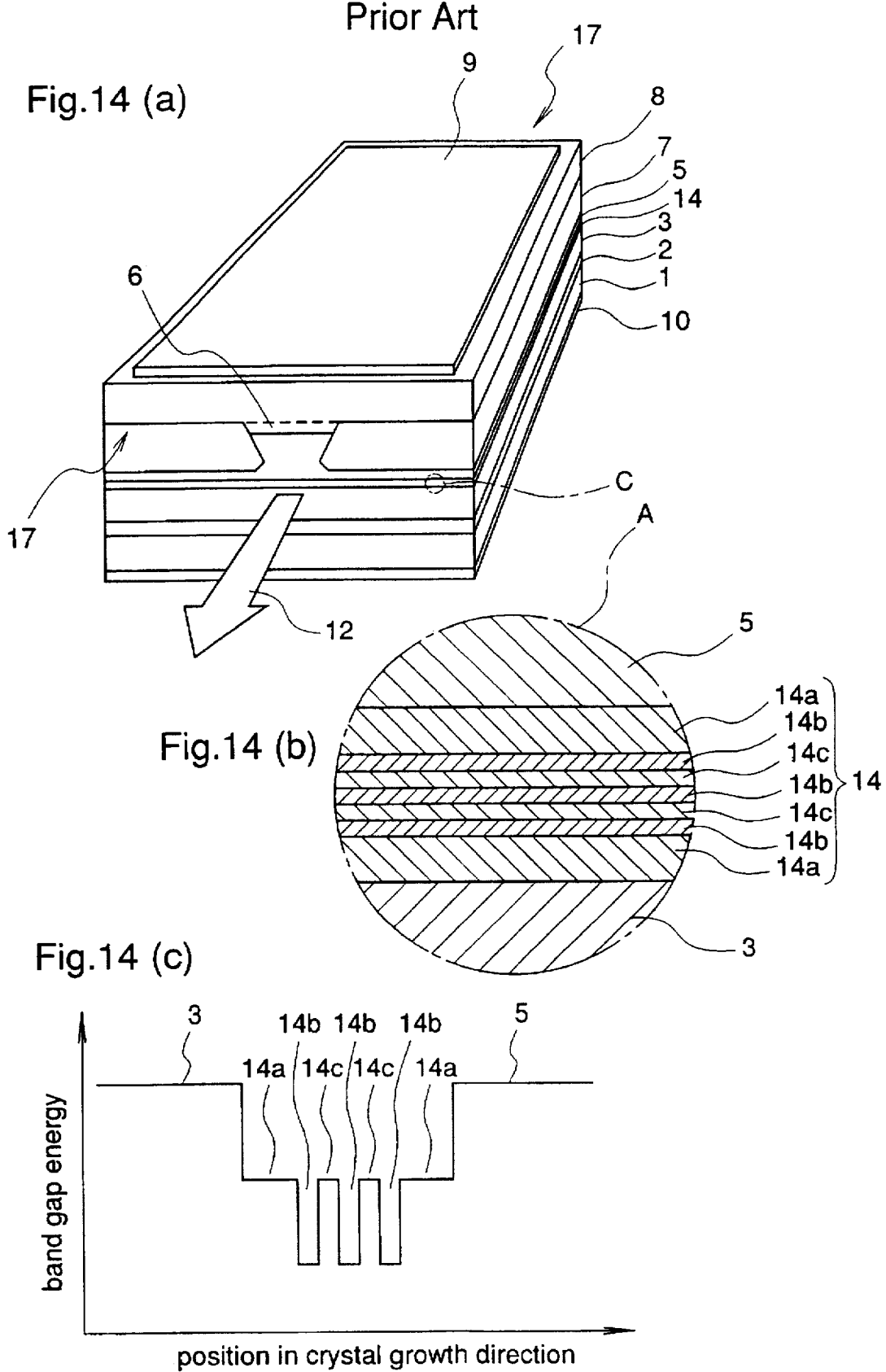
FIG. 14(a) is a perspective view illustrating another semiconductor laser device according to the prior art.
FIG. 14(b) is a enlarged view in the vicinity of the active layer of the semiconductor laser device.
FIG. 14(c) is a band diagram in the vicinity of the active layer of the semiconductor laser device.
Figure 15:
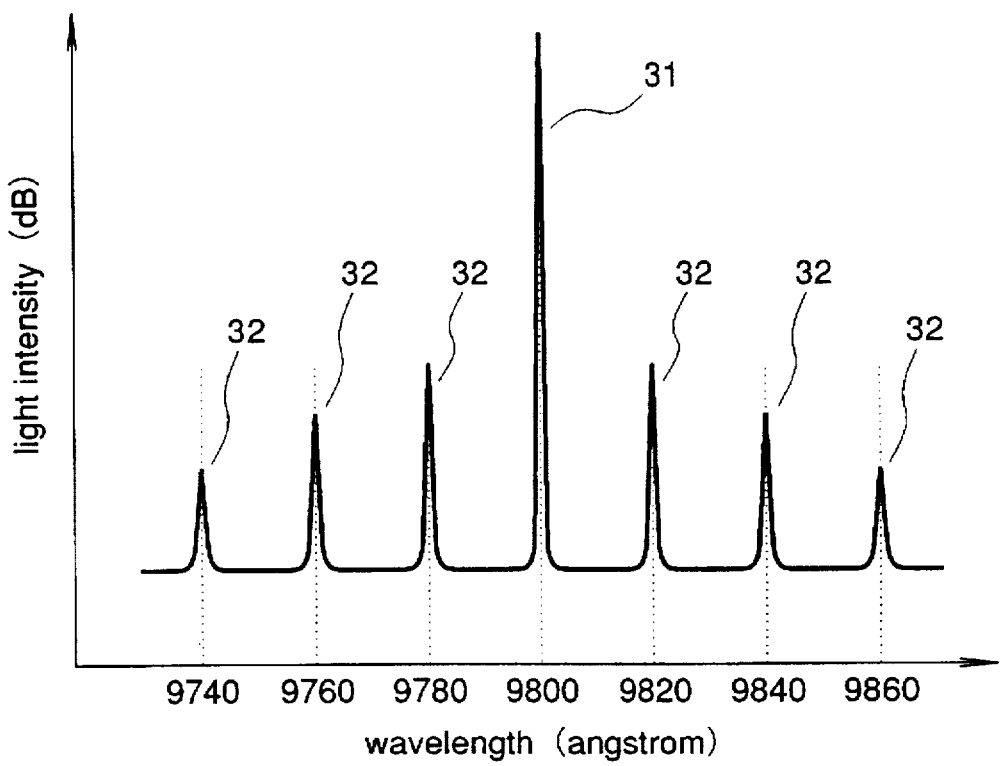
FIGS. 15(a)-15(b) are graphs showing mode spectrums of the prior art semiconductor laser device.
Figure 15:
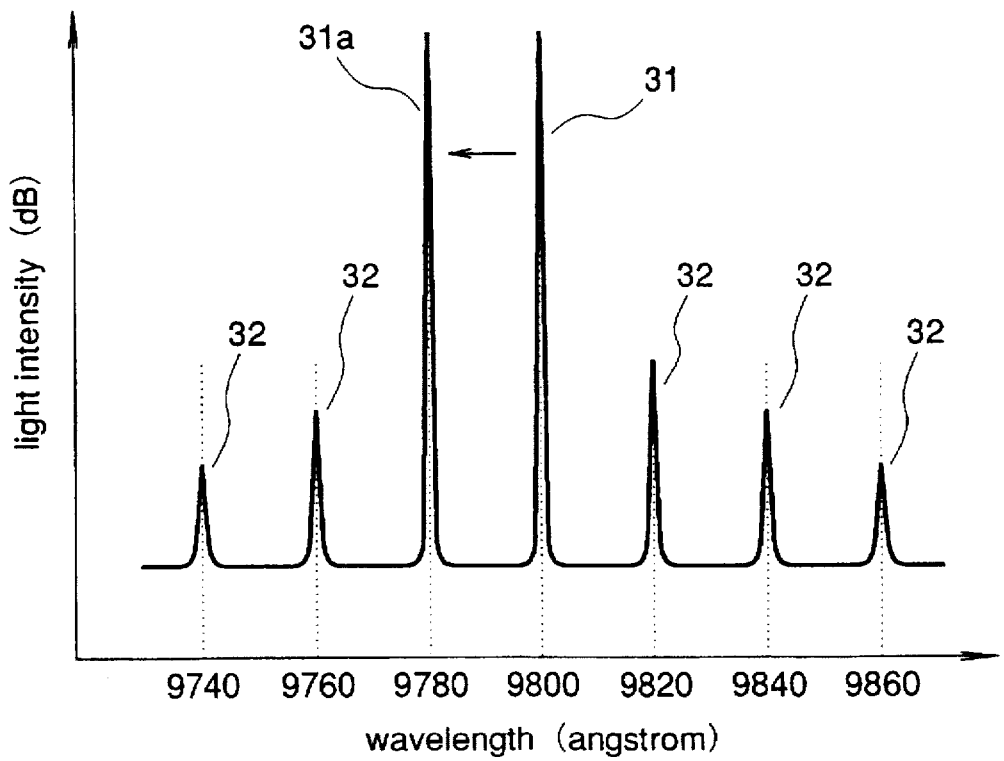
Figure 16:
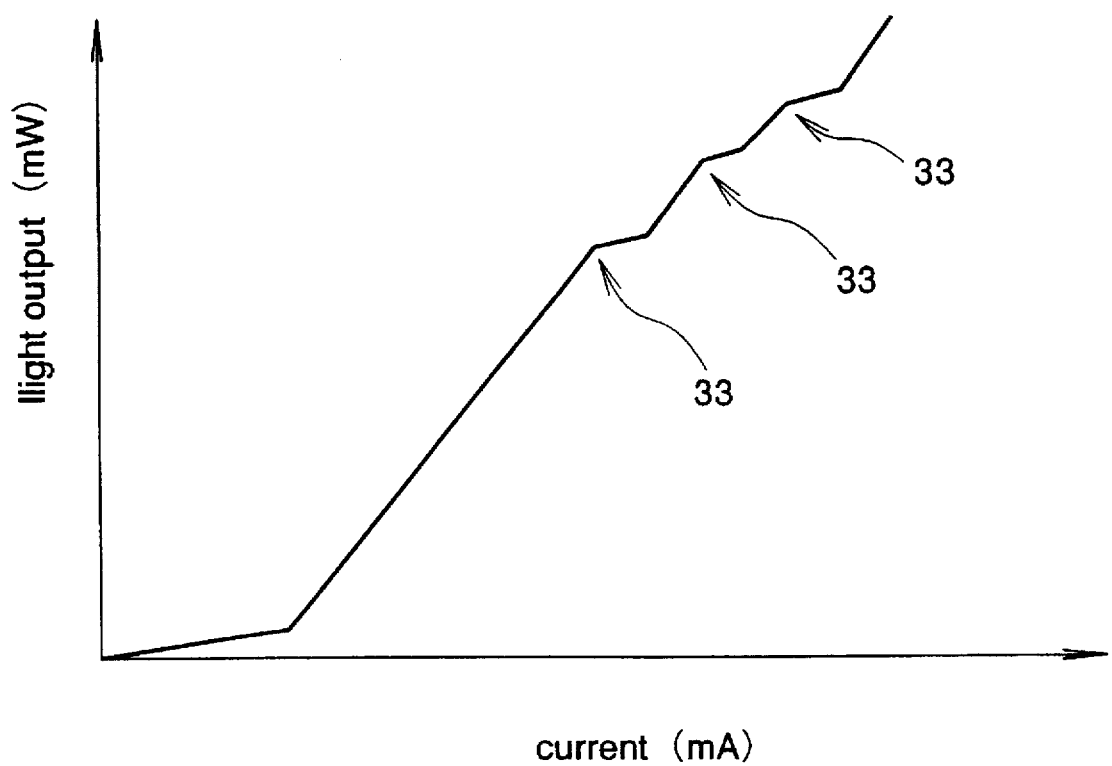
FIG. 16 is a graph showing a relation between light output and operating current of the prior art semiconductor laser service.

FIG. 11 is a graph showing a relation between thickness at a thickest part of the p type $Al_tGa_{1-t}As$ (t=0.48) upper cladding layer 5, i.e., thickness including the ridge structure, and a lifetime in the prior art semiconductor laser device which oscillates at 0.98 μm shown in FIG. 12. In FIG. 11, the ordinate indicates an operating current (mA), the and abscissa indicates an operating time (hrs) and shows a change of the operating current of the semiconductor laser device in a case where the operating temperature is 50° C. and the output is 100 mW. In FIG. 11, a case where the thickness of the upper cladding layer is 4 μm is shown by 50 and a case where the thickness of the upper cladding layer is 3 μm is shown by 51.

In the prior art semiconductor laser device which oscillates in 0.98 μm shown at FIG. 12, the laser beams reaching the p side electrode 9 and the n side electrode 10 are decreased and the generation of kinks is prevented by making the thickness of the p type $Al_tGa_{1-t}As$ upper cladding layer 5 larger than 4 μm. As shown in FIG. 11, however, when the the $Al_tGa_{1-t}As$ upper cladding layer 5 is made thick, the lifetime is degraded. Although the difference in the lattice constants between the GaAs substrate 1 and the AlGaAs upper cladding layer 5 is 0.06% and this means that the lattice irregularity is very small, this result is attributed to the fact that the lattice irregularity is emphasized by increasing the thickness of the layer.

In the sixth embodiment, in order to solve the problem, in the p type $In_rGa_{1-r}P$ upper cladding layer 25 the In composition ratio is adjusted to equal the lattice constant of the n type GaAs substrate is formed instead of the p type $Al_tGa_{1-t}As$ upper cladding layer 5. Therefore, the thickness of the region above the emission region of the active layer 4 is thicker than 4 μm, as in the first embodiment. Therefore, since the thickness of the $In_rGa_{1-r}P$ upper cladding layer 25 above the emission region is thicker than 4 μm and the lattice constant of the upper cladding layer 25 is coincides with that of the GaAs substrate 1, degradation of the lifetime of the semiconductor laser device due to the lattice irregularity is prevented. Here, the In composition ratio r of the p type $In_rGa_{1-r}P$ upper cladding layer 25 is about 0.51 to make the lattice constant coincide with that of the GaAs substrate 1.

As described above, according to the sixth embodiment, in the semiconductor laser device having an oscillation wavelength of 0.98 μm and including the quantum well active layer 4 which comprises the InGaAs well layers 4b, the AlGaAs light guide layers 4a, and the AlGaAs barrier layer 4c, since the material of the p type upper cladding layer 25 is p type $In_rGa_{1-r}P$, the In composition ratio is adjusted to equal the lattice constant of the n type GaAs substrate 1 and the thickness of the thickest part on the emission region of the active layer 4 is thicker than 4 μm. The laser beams advancing in the direction of the p side electrode 9, among the laser beams advancing in a direction other than the resonator length direction in the semiconductor laser device, do not reach the p side electrode, and the oscillation of the laser beams between the p side electrode and the n side electrode is suppressed to prevent the generation of kinks, thereby producing a stable high power output semiconductor laser device without reducing the lifetime.

While in the first to sixth embodiments the semiconductor laser device having an oscillation wavelength of 0.98 μm and including the quantum well active layer 4 which comprises the $In_xGa_{1-x}As$ (x=0.2) well layers 4b, the $Al_yGa_{1-y}As$ (y=0.2) light guide layers 4a, and the $Al_yGa_{1-y}As$ (y=0.2) barrier layer 4c is explained, in the present invention the semiconductor laser device including the quantum well active layer of a multi-quantum-well structure which comprises $Al_yGa_{1-y}As$ (y>0) barrier layers and $In_xGa_{1-x}As$ (x>0) well layers and oscillates at 0.9~1.2 μm or a single-quantum-well structure may be applied, with the same effects as in the first embodiment.

In addition, while in the first embodiment an index guiding type semiconductor laser device including the ridge structure is explained, in the present invention a semiconductor laser device including another structure may be applied, with the same effects as in the first embodiment.

What is claimed is:

1. A semiconductor laser device comprising:

a first conductivity type GaAs substrate having opposed front and rear surfaces;

a first conductivity type GaAs buffer layer disposed on the front surface of the first conductivity type GaAs substrate;

a first conductivity type $Al_sGa_{1-s}As$ (0<s<1) cladding layer disposed on the first conductivity type GaAs buffer layer;

a quantum well active layer having a structure that can oscillate at a wavelength of 0.9~1.2 μm and including a well layer comprising $In_xGa_{1-x}As$ (0<x<1) and a barrier layer comprising $Al_yGa_{1-y}As$ (0<y<s), disposed on the first cladding layer;

a second conductivity type $Al_tGa_{1-t}As$ (y<t<1) cladding layer disposed on the active layer;

a second conductivity type GaAs contact layer disposed on the second conductivity type cladding layer;

a multiple reflection film layer, including alternatingly laminated, layers of first and second semiconductor materials which have the same conductivity type as adjacent semiconductor layers and have different refractive indexes disposed parallel to the active layer but not in contact with the active layer, at a position relative to the active layer;

a first electrode disposed on the rear surface of the semiconductor substrate;

a second electrode disposed on the second conductivity type contact layer; and a pair of laser resonator facets perpendicular to the active layer and the multiple reflection film layer.

2. The semiconductor laser device of claim 1 wherein said first semiconductor material is AlAs and said second semiconductor material is GaAs.

3. The semiconductor laser device of claim 1 wherein an upper portion of the second conductivity type cladding layer and a lower portion of the second conductivity type contact layer form a stripe shaped ridge structure extending perpendicular to the resonator facets; and including first conductivity type $Al_uGa_{1-u}As$ (t<u<1) current blocking layers disposed at opposite sides of and burying the ridge structure.

4. The semiconductor laser device of claim 3 wherein:

said first conductivity type substrate is n type GaAs;
   said first conductivity type buffer layer is n type GaAs;
   said first conductivity type lower cladding layer is n type $Al_sGa_{1-s}As$ (s=0.48);

said quantum well active layer has five layer structure alternatingly laminating three $Al_yGa_{1-y}As$ (y=0.2) barrier layers and two $In_xGa_{1-x}As$ (x=0.2) well layers;

said second conductivity type upper cladding layer is p type $Al_tGa_{1-t}As$ (t=0.48);

said second conductivity type contact layer is p type GaAs;

said first conductivity type current blocking layers are n type $Al_uGa_{1-u}As$ (u=0.7);

said first semiconductor material is a p type AlAs;

said second semiconductor material is a p type GaAs; and said multiple reflection film layer is disposed at a position in the contact layer.

5. The semiconductor laser device of claim 1 wherein the active layer has a structure that can oscillate at a wavelength of 0.98 μm.

6. The semiconductor laser device of claim 1 wherein the multiple reflection film layer is disposed at a position within the contact layer.

7. A semiconductor laser device comprising:

a first conductivity type GaAs substrate having opposed front and rear surfaces;

a first conductivity type GaAs buffer layer disposed on the front surface of the first conductivity type GaAs substrate;

a first conductivity type $Al_sGa_{1-s}As$ (0<s<1) cladding layer disposed on the first conductivity type GaAs buffer layer;

a quantum well active layer having a structure that can produce an oscillation wavelength of 0.9~1.2 μm and including a well layer comprising $In_xGa_{1-x}As$ (0<x<1) and a barrier layer comprising $Al_yGa_{1-y}As$ (0<y<s), disposed on the first conductivity type cladding layer;

a second conductivity type $Al_tGa_{1-t}As$ (y<t<1) cladding layer disposed on the active layer;

a second conductivity type contact layer disposed on the second conductivity type cladding layer;

a first electrode disposed on the rear surface of the semiconductor substrate;

a second electrode disposed on the second conductivity type contact layer; and a pair of resonator facets perpendicular to the active layer, wherein one of said semiconductor substrate, said buffer layer, and said contact layer comprising a material absorbing laser light generated in the active layer and the other layers being GaAs.

8. The semiconductor laser device of claim 7 wherein all of the layer comprising a material absorbing laser light comprises the material absorbing laser light.

9. The semiconductor laser device of claim 7 wherein an upper portion of said second conductivity type cladding layer and a lower portion of said second conductivity type contact layer form a ridge structure extending perpendicular to the resonator facets and first conductivity type $Al_uGa_{1-u}As$ (t<u<1) current blocking layers at opposite sides of the ridge structure the ridge structure.

10. The semiconductor laser device of claim 9 wherein:

said first conductivity type substrate is n type GaAs;

said first conductivity type buffer layer is n type GaAs;

said first conductivity type lower cladding layer is n type $Al_sGa_{1-s}As$ (s=0.48);

said quantum well active layer comprises a five-layer structure alternatingly laminating three $Al_yGa_{1-y}As$ (y=0.2) barrier layers and two $In_xGa_{1-x}As$ (x=0.2) well layers;

said second conductivity type upper cladding layer is p type $Al_tGa_{1-t}As$ (t=0.48);

said first conductivity type current blocking layers are n type $Al_uGa_{1-u}As$ (u=0.7); and said second conductivity type contact layer is p type Ge.

11. The semiconductor laser device of claim 9 wherein:

said first conductivity type substrate is n type Si;

said first conductivity type buffer layer is n type GaAs;

said first lower cladding layer is n type $Al_sGa_{1-s}As$ (s=0.48);

said quantum well active layer comprises five-layer structure alternatingly laminating three $Al_yGa_{1-y}As$ (y=0.2) barrier layers and two $In_xGa_{1-x}As$ (x=0.2) well layers;

said second conductivity type upper cladding layer is p type $Al_tGa_{1-t}As$ (t=0.48);

said first conductivity type are n type $Al_uGa_{1-u}As$ (u=0.7) current blocking layers; and said second conductivity type contact layer is p type GaAs.

12. The semiconductor laser device of claim 9 wherein:

said first conductivity type substrate is n type GaAs;

said first conductivity type buffer layer is n type GaAs;

said first lower cladding layer is n type $Al_sGa_{1-s}As$ (s=0.48);

said quantum well active layer comprises a five-layer structure alternatingly laminating three $Al_yGa_{1-y}As$ (y=0.2) barrier layers and two $In_xGa_{1-x}As$ (x=0.2) well layers;

said second conductivity type upper cladding layer is p type $Al_tGa_{1-t}As$ (t=0.48);

said first conductivity type current blocking layers are n type $Al_uGa_{1-u}As$ (u=0.7); and said second conductivity type contact layer is p type $In_vGa_{1-v}As$ (v=0.3).

13. The semiconductor laser device of claim 7 wherein the active layer comprises a structure that can produce an oscillation wavelength of 0.98 μm.

14. The semiconductor laser device of claim 8 wherein the layer comprising a material absorbing the laser light is the contact layer and the material thereof is germanium (Ge).

15. The semiconductor laser device of claim 8 wherein said layer comprising a material absorbing the laser light is the semiconductor substrate and the material thereof is silicon (Si).

16. The semiconductor laser device of claim 8 wherein the layer comprising the material absorbing the laser light is the contact layer and the material thereof is $In_vGa_{1-v}As$ (0.2<v).

17. A semiconductor laser device comprising:

a first conductivity type GaAs substrate having opposed front and rear surfaces;

a first conductivity type GaAs buffer layer disposed on the front surface of the first conductivity type GaAs substrate;

a first conductivity type $Al_sGa_{1-s}As$ (0<s<1) cladding layer disposed on the first conductivity type GaAs buffer layer;

a quantum well active layer having a structure that can produce an oscillation wavelength of 0.9~1.2 μm and including a well layer comprising $In_xGa_{1-x}As$ (0<x<1)

and a barrier layer comprising $Al_yGa_{1-y}As$ (0<y<s), disposed on the first conductivity type cladding layer;

a second conductivity type $Al_tGa_{1-t}As$ (y<t<1) cladding layer disposed on the active layer;

a second conductivity type GaAs contact layer disposed on the second conductivity type cladding layer;

a critical film thickness layer laminated structure alternatingly laminating a layer having a first strain relative to the substrate, having a thickness less than a critical film thickness, and comprising a material absorbing laser light, and a layer having a second strain relative to the substrate, smaller than the first strain, not in contact with the active layer, and having the same conductivity type as adjacent layers;

a first electrode disposed on the rear surface of the GaAs substrate;

a second electrode disposed on the upper surface of the contact layer; and a pair of resonator facets perpendicular to the active layer.

18. The semiconductor laser device of claim 17 wherein the layer having the second strain is an $Al_wGa_{1-w}As$ (w>0) layer and the layer having first strain is an $In_zGa_{1-z}As$ (z>0.2) layer.

19. The semiconductor laser device of claim 17 wherein an upper portion of the second conductivity type cladding layer and a lower portion of the second conductivity type contact layer form a stripe shaped ridge structure extending perpendicular to the resonator facets and including first conductivity type $Al_uGa_{1-u}As$ (s<u<1) current blocking layers disposed at opposite sides of the ridge structure burying the ridge structure.

20. The semiconductor laser device of claim 19 wherein said first conductivity type substrate is n type GaAs substrate;

said first conductivity type buffer layer is an n type GaAs buffer layer;

said first conductivity type lower cladding layer is an n type $Al_sGa_{1-s}As$ (s=0.48) lower cladding layer;

said quantum well active layer comprises a five-layer structure alternatingly laminating three $Al_yGa_{1-y}As$ (y=0.2) barrier layers and two $In_xGa_{1-x}As$ (x=0.2) well layers;

said second conductivity type upper cladding layer is a p type $Al_tGa_{1-t}As$ (t=0.48) upper cladding layer;

said second conductivity type contact layer is a p type GaAs contact layer;

said first conductivity type current blocking layer is an n type $Al_uGa_{1-u}As$ (u=0.7) current blocking layer;

said layer having small strain is a p type $Al_wGa_{1-w}As$ (w=0.48) layer;

said layer having large strain is a p type $In_zGa_{1-z}As$ (z=0.3) layer; and said critical film thickness layer laminated structure is disposed at a position of a predetermined height in the contact layer.

21. The semiconductor laser device of claim 17 wherein the active layer has a structure that can produce an oscillation wavelength of 0.98 μm band.

22. A semiconductor laser device comprising:

a first conductivity type GaAs substrate having opposed front and rear surfaces;

a first conductivity type GaAs buffer layer disposed on the front surface of the first conductivity type GaAs substrate;

a first conductivity type $Al_sGa_{1-s}As$ (0<s<1) cladding layer disposed on the first conductivity type GaAs buffer layer;

a quantum well active layer having a structure that can produce an oscillation wavelength of 0.9~1.2 μm and including a well layer comprising $In_xGa_{1-x}As$ (0<x<1) and a barrier layer comprising $Al_yGa_{1-y}As$ (0<y<s), disposed on the first conductivity type cladding layer;

a second conductivity type cladding layer comprising $In_rGa_{1-r}P$ having an In composition ratio r so as to have the same lattice constant as that of the first conductivity type GaAs substrate and having a thickness larger than 4 μm on a light emitting region of the active layer, disposed on the quantum well active layer;

a second conductivity type GaAs contact layer disposed on the second conductivity type cladding layer;

a first electrode disposed on the rear surface of the GaAs substrate;

a second electrode disposed on the second conductivity type contact layer; and a pair of resonator facets perpendicular to the active layer.

23. The semiconductor laser device of claim 22 wherein the In composition ratio r of the second conductivity type cladding layer is 0.51.

24. The semiconductor laser device of claim 22 wherein a upper portion of the second conductivity type cladding layer and a lower portion of the second conductivity type contact layer form a ridge structure extending perpendicular to the resonator facets and including first conductivity type $Al_uGa_{1-u}As$ (0<u<1) current blocking layers in which a ratio is adjusted to produce a band gap energy larger than that of the $In_rGa_{1-r}P$ cladding layer provided at opposite sides of the ridge structure bury the ridge structure.

25. The semiconductor laser device of claim 24 wherein:

said first conductivity type substrate is n type GaAs;

said first conductivity type buffer layer is n type GaAs;

said first conductivity type lower cladding layer is n type $Al_sGa_{1-s}As$ (s=0.48);

said quantum well active layer comprises a five-layer structure alternatingly laminating three $Al_yGa_{1-y}As$ (y=0.2) barrier layers and two $In_xGa_{1-x}As$ (x=0.2) well layers;

said second conductivity type upper cladding layer is p type $In_rGa_{1-r}As$ (r=0.51);

said second conductivity type contact layer is p type GaAs; and said first conductivity type current blocking layer is n type $Al_uGa_{1-u}As$ (u=0.7).

26. The semiconductor laser device of claim 22 wherein the active layer has a structure that can produce an oscillation wavelength of 0.98 μm band.

* * * * *

UNITED STATES PATENT AND TRADEMARK OFFICE
CERTIFICATE OF CORRECTION

PATENT NO. : 5,675,601
DATED : October 7, 1997
INVENTOR(S) : Karakida et al.

It is certified that error appears in the above-indentified patent and that said Letters Patent is hereby corrected as shown below:

Column 27, Line 58, after "and" insert --including--;

Line 61, after "structure" insert --burying--;

Column 28, Line 15, after "comprises" insert --a--;

Column 29, Line 24, after "having" insert --the--;

Line 38, delete --substrate--;

Line 39, delete --an--;

Line 40, delete --buffer layer--;

Line 41, delete --an--

Line 42, delete --lower cladding layer--;

Line 48, delete --upper cladding layer--;

Line 50, delete --a--;

Line 51, delete --contact layer--;

Line 52, delete --an--;

UNITED STATES PATENT AND TRADEMARK OFFICE
CERTIFICATE OF CORRECTION

PATENT NO. :   5,675,601
DATED      :   October 7, 1997
INVENTOR(S) :  Karakida et al.

It is certified that error appears in the above-indentified patent and that said Letters Patent is hereby corrected as shown below:

Line 53, delete --current blocking layer--;

Line 54, change "small" to --the second--;

Line 55, delete --layer--;

Line 56, change "large" to --the first--;

Line 57, delete --layer--

Line 59, delete --of a predetermined height--;

Column 30, Line 39, change "a ratio" to --u--.

Signed and Sealed this

Nineteenth Day of May, 1998

Attest:

BRUCE LEHMAN

*Attesting Officer*    *Commissioner of Patents and Trademarks*